United States Patent
Kouno et al.

(10) Patent No.: US 8,749,065 B2
(45) Date of Patent: Jun. 10, 2014

(54) SEMICONDUCTOR DEVICE COMPRISING ELECTROMIGRATION PREVENTION FILM AND MANUFACTURING METHOD THEREOF

(75) Inventors: Ichiro Kouno, Hamura (JP); Takeshi Wakabayashi, Sayama (JP); Ichiro Mihara, Tachikawa (JP)

(73) Assignee: Tera Probe, Inc., Kanagawa (JP)

( * ) Notice: Subject to any disclaimer, the term of this patent is extended or adjusted under 35 U.S.C. 154(b) by 1247 days.

(21) Appl. No.: 12/009,719

(22) Filed: Jan. 22, 2008

(65) Prior Publication Data
US 2008/0191357 A1    Aug. 14, 2008

(30) Foreign Application Priority Data

Jan. 25, 2007  (JP) .................. 2007-014533
Mar. 29, 2007  (JP) .................. 2007-086418

(51) Int. Cl.
*H01L 23/48*    (2006.01)

(52) U.S. Cl.
USPC .......................... 257/762; 257/750; 438/614

(58) Field of Classification Search
USPC ....................................... 257/762
See application file for complete search history.

(56) References Cited

U.S. PATENT DOCUMENTS

| | | | |
|---|---|---|---|
| 5,391,397 A | 2/1995 | Mukerji | |
| 7,122,897 B2 * | 10/2006 | Aiba et al. | 257/738 |
| 2002/0017730 A1 * | 2/2002 | Tahara et al. | 257/786 |
| 2004/0094842 A1 | 5/2004 | Jimarez et al. | |
| 2005/0084989 A1 * | 4/2005 | Wakabayashi et al. | 438/14 |
| 2006/0060984 A1 * | 3/2006 | Wakabayashi et al. | 257/780 |
| 2006/0214296 A1 | 9/2006 | Okamoto et al. | |

FOREIGN PATENT DOCUMENTS

| | | |
|---|---|---|
| JP | 2001-144213 | 5/2001 |
| JP | 2004-207268 A | 7/2004 |
| JP | 2004-207306 A | 7/2004 |
| JP | 2004-349610 A | 12/2004 |
| JP | 2005-260081 A | 9/2005 |
| JP | 2006-147810 A | 6/2006 |
| KR | 10-2006-0103799 A | 10/2006 |

OTHER PUBLICATIONS

Notification Concerning Transmittal of International Search Report and Written Opinion of the International Searching Authority, Dated Jun. 20, 2008, for PCT/JP2008/051594.
Japanese Office Action dated Nov. 2, 2010 (and English translation thereof) in counterpart Japanese Application No. 2007-086418.
Japanese Office Action dated Nov. 2, 2010 (and English translation thereof) in counterpart Japanese Application No. 2007-014533.
Korean Office Action dated Feb. 11, 2011 (and English translation thereof) in counterpart Korean Application No. 10-2009-7014906.
Japanese Office Action dated Feb. 22, 2011 (and English translation thereof) in counterpart Japanese Application No. 2007-086418.

* cited by examiner

*Primary Examiner* — Mark Tornow
(74) *Attorney, Agent, or Firm* — Holtz Holtz Goodman & Chick PC

(57) ABSTRACT

A semiconductor device includes a semiconductor substrate, a plurality of wiring lines which are provided on one side of the semiconductor substrate and which have connection pad portions, and a plurality of columnar electrodes respectively provided on the connection pad portions of the wiring lines, each of the columnar electrodes including an outer peripheral surface and a top surface. An electromigration prevention film is provided on at least the surfaces of the wiring lines. A sealing film is provided around the outer periphery surfaces of the columnar electrodes.

7 Claims, 34 Drawing Sheets

SEMICONDUCTOR DEVICE COMPRISING ELECTROMIGRATION PREVENTION FILM AND MANUFACTURING METHOD THEREOF

CROSS-REFERENCE TO RELATED APPLICATIONS

This application is based upon and claims the benefit of priority from prior Japanese Patent Applications No. 2007-014533, filed Jan. 25, 2007; and No. 2007-086418, filed Mar. 29, 2007, the entire contents of both of which are incorporated herein by reference.

BACKGROUND OF THE INVENTION

1. Field of the Invention

This invention relates to a semiconductor device comprising an electromigration prevention film and a manufacturing method thereof.

2. Description of the Related Art

A semiconductor device called a chip size package (CSP) has been described in Jpn. Pat. Appln. KOKAI Publication No. 2004-207306. This semiconductor device comprises a semiconductor substrate having a plurality of connection pads provided on its upper surface. On the upper surface of an insulating film provided on the semiconductor substrate, a plurality of wiring lines are provided so that they are electrically connected to the respective connection pads. Columnar electrodes are provided on the respective upper surfaces of connection pad portions of these wiring lines. A sealing film is provided on the upper surfaces of the wiring lines and the insulating film so that the upper surface of this sealing film is flush with the upper surfaces of the columnar electrodes. Solder balls are respectively provided on the upper surfaces of the columnar electrodes.

In the conventional semiconductor device described above, the sealing film directly covering the wiring lines is formed of an epoxy resin, so that there is such a problem that metal (copper) ions in the wiring lines diffuse into the sealing film due to the generation of electromigration, which is one factor of a short circuit caused between the wiring lines.

Furthermore, an epoxy resin in which fillers made of, for example, silica may be used as the material of the sealing film. In such a semiconductor device, the wiring lines may be mechanically damaged by the fillers. In preventing the breaking of the wiring lines due to the mechanical damage, there is a problem of a limit in the miniaturization of the wiring lines.

BRIEF SUMMARY OF THE INVENTION

It is therefore an object of this invention to provide a semiconductor device and a manufacturing method thereof which can prevent a short circuit caused between wiring lines by electromigration and which makes it possible to prevent the wiring lines from being easily mechanically damaged by fillers even if a resin containing the fillers is used as the material of a sealing film.

A semiconductor device according to a first aspect of the present invention comprising:

a semiconductor substrate;

a plurality of wiring lines which are provided on one side of the semiconductor substrate and which have connection pad portions;

a plurality of columnar electrodes respectively provided on the connection pad portions of the wiring lines, each of the columnar electrodes including an outer peripheral surface and a top surface;

an electromigration prevention film provided on at least the surfaces of the wiring lines; and a sealing film provided around the outer periphery surfaces of the columnar electrodes.

A semiconductor device according to a second aspect of the present invention claim comprising:

a semiconductor substrate;

a plurality of wiring lines provided on an upper side of the semiconductor substrate;

an inorganic insulating film which is provided on the surfaces of the wiring lines and which has openings in parts corresponding to connection pad portions of the wiring lines;

an overcoat film made of an organic resin which is provided on the upper surface of the inorganic insulating film and the upper side of the semiconductor substrate and which has openings in parts corresponding to the connection pad portions of the wiring lines; and a plurality of columnar electrodes which are provided in the openings of the inorganic insulating film and in and above the openings of the overcoat film and which are electrically connected to the connection pad portions of the wiring lines.

A manufacturing method of an invention according to a third aspect of the present invention comprising:

forming a plurality of wiring lines on an upper side of a semiconductor substrate;

forming a plurality of columnar electrodes on connection pad portions of the wiring lines;

forming an electromigration prevention film on surfaces of the wiring lines, on surfaces of the columnar electrodes and on the upper side of the semiconductor substrate;

forming a sealing film on the electromigration prevention film; and grinding an upper surface side of the sealing film to expose upper surfaces of the columnar electrodes.

A manufacturing method of an invention according to a fourth aspect of the present invention comprising:

forming a plurality of wiring lines on an upper side of a semiconductor substrate;

forming a plurality of columnar electrodes on connection pad portions of the wiring lines;

forming an electromigration prevention film on surfaces of the wiring lines, on surfaces of the columnar electrodes and on the upper side of the semiconductor substrate;

removing the electromigration prevention film formed on the surfaces of upper portions of the columnar electrodes;

forming a sealing film on the electromigration prevention film and the columnar electrodes; and grinding an upper surface side of the sealing film to expose upper surfaces of the columnar electrodes.

A semiconductor device manufacturing method according to a fifth aspect of the present invention comprising:

forming a plurality of wiring lines on an upper side of semiconductor substrate;

forming, on surfaces of the wiring lines, an inorganic insulating film having openings in parts corresponding to connection pad portions of the wiring lines;

forming, on the upper side of the semiconductor substrate and on the inorganic insulating film, an overcoat film made of an organic resin having openings in parts corresponding to the connection pad portions of the wiring lines; and forming, by electrolytic plating, columnar electrodes in the openings of the inorganic insulating film and in and above the openings of the overcoat film.

According to the present inventions, the electromigration prevention film is provided on at least the surfaces of the wiring lines, and it is therefore possible to prevent a short circuit caused between the wiring lines by electromigration.

Moreover, the electromigration prevention film functions as a protective film, which makes it possible to prevent the wiring lines from being easily mechanically damaged by fillers even if a resin containing the fillers is used as the material of the sealing film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
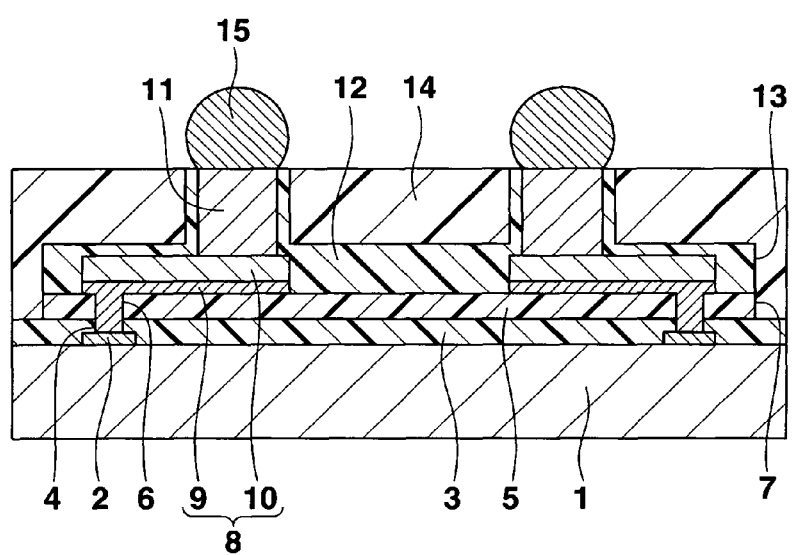
FIG. 1 is a sectional view of a semiconductor device as a first embodiment of this invention.

FIG. 1 shows a sectional view of a semiconductor device as a first embodiment of this invention. This semiconductor device is called a CSP, and comprises a silicon substrate (semiconductor substrate) 1. An integrated circuit (not shown) is provided on or in the upper surface of the silicon substrate 1, and a plurality of connection pads 2 made of a metal such as an aluminum-based metal are provided in peripheral parts of the upper surface of the silicon substrate 1 so that these connection pads are electrically connected to the integrated circuit.

An insulating film 3 made of an inorganic material such as silicon oxide or silicon nitride is provided on the upper surfaces of the connection pads 2 except for the centers of the connection pads 2 and on the upper surface of the silicon substrate 1. The centers of the connection pads 2 are exposed via openings 4 provided in the insulating film 3. An electrically insulating protective film 5 made of an organic material such as a polyimide resin or poly benzo oxysazole (PBO) resin is provided on the upper surface of the insulating film 3. Openings 6 are provided in parts of the protective film 5 corresponding to the openings 4 of the insulating film 3. A recess or groove 7 is provided in a peripheral part of the protective film 5.

A plurality of wiring lines 8 are provided on the upper surface of the protective film 5. Each of the wiring lines 8 has a double-layered structure composed of a foundation metal layer 9 made of, for example, copper provided on the upper surface of the protective film 5 and an upper metal layer 10 made of copper provided on the upper surface of the foundation metal layer 9. One end of the wiring line 8 is electrically connected to the connection pad 2 via the aligned openings 4, 6 of the insulating film 3 and the protective film 5. Columnar (projection) electrodes 11 made of copper are provided on the other ends or on the upper surfaces of connection pad portions of the wiring lines 8.

Provided on the surfaces of the wiring lines 8 and on the upper surface of the protective film 5 is an electromigration prevention film 12 which is made of a polyimide resin or PBO resin and which partly projects cylindrically to cover the outer peripheral surfaces of the columnar electrodes 11. A recess 13 is provided in the peripheral part of the electromigration prevention film 12 in a part corresponding to the recess 7 of the protective film 5. As a result, the outer surface of the protective film 5 is preferably flush with the outer surface of the electromigration prevention film 12.

On the upper surface of the insulating film 3 exposed via the recesses 7, 13 of the protective film 5 and the electromigration prevention film 12 and on the upper surface of the electromigration prevention film 12, a sealing film 14 made of an epoxy resin containing fillers made of, for example, silica is provided so that the upper surface of this sealing film 14 may be flush with the upper surfaces of the columnar electrodes 11. This sealing film 14 encloses the side surfaces of the columnar electrodes 11 via the cylindrical projections of the electromigration prevention film 12. Solder balls 15 are respectively provided on the upper surfaces of the respective columnar electrodes 11.

Figure 2:
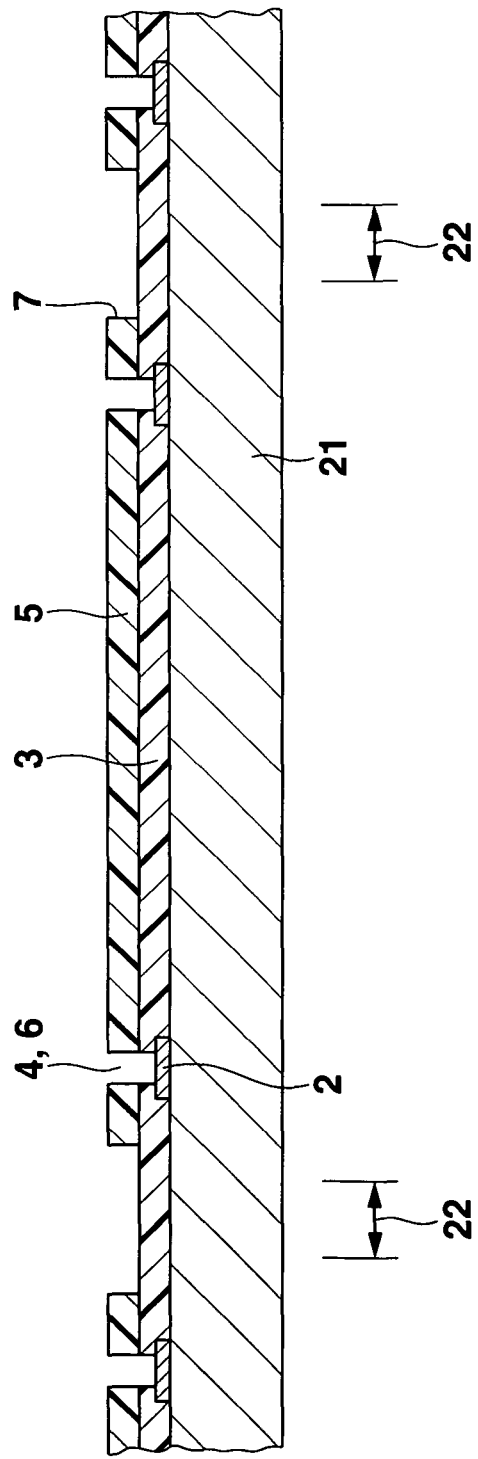
FIG. 2 is a sectional view of an initially prepared assembly in one example of a method of manufacturing the semiconductor device shown in FIG. 1.

Next, one example of a method of manufacturing this semiconductor device will be described. First, as shown in FIG. 2, an assembly is prepared wherein the connection pads 2 made of the aluminum-based metal, the insulating film 3 made of, for example, silicon oxide or silicon nitride, and the protective film 5 made of, for example, the polyimide resin or PBO resin are formed on the upper side of the silicon substrate (hereinafter referred to as a semiconductor wafer 21) in a wafer state, and the centers of the connection pads 2 are exposed via the openings 4, 6 formed through the insulating film 3 and the protective film 5.

In this case, integrated circuits (not shown) with a predetermined function are formed in regions of the upper surface of the semiconductor wafer 21 where the semiconductor devices are formed, and the connection pads 2 of each group are electrically connected to each of the integrated circuits formed in corresponding parts. In FIG. 2, regions indicated by a numeral 22 correspond to dicing lines. The recesses or grooves 7 extending along the upper surface of the wafer 21 are formed in parts of the protective film 5 corresponding to the dicing line 22 and both sides thereof.

Figure 3:
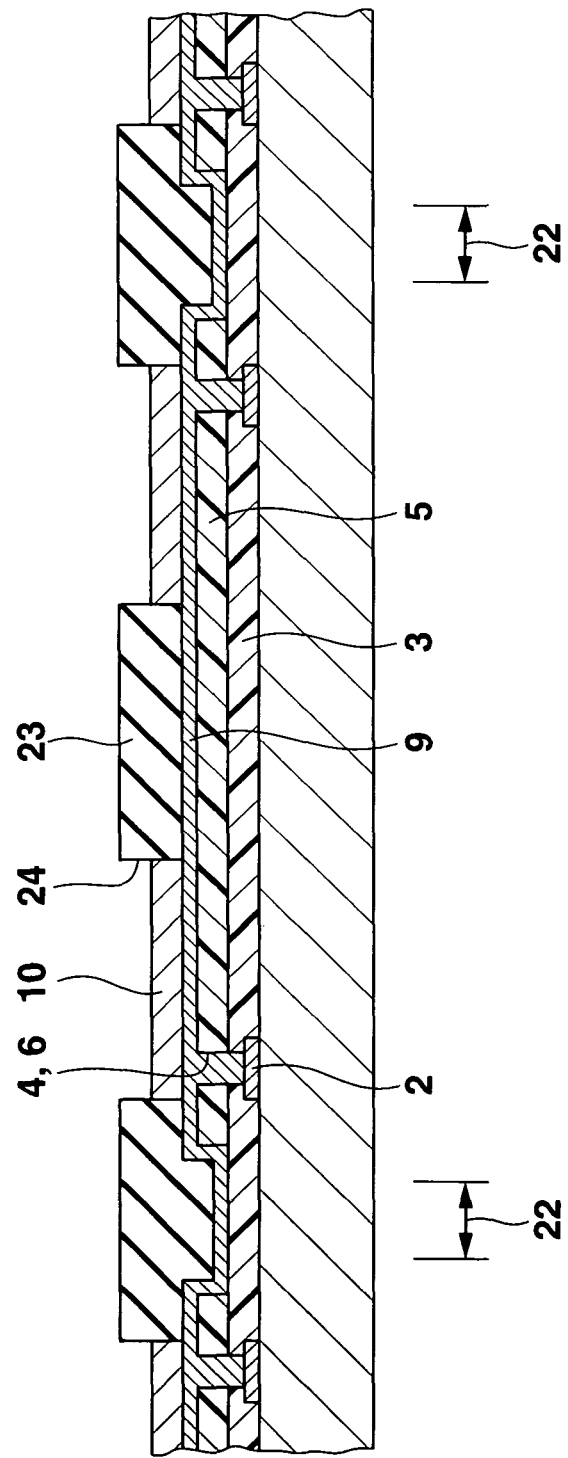
FIG. 3 is a sectional view in a step following FIG. 2.

Next, as shown in FIG. 3, the foundation metal layer 9 is formed on the central upper surfaces of the connection pads 2 exposed via the openings 4, 6 of the insulating film 3 and the protective film 5, on the insulating film 3, and on the entire upper surface of the protective film 5. This foundation metal layer 9 is not limited in its formation method and conductive material, and may only be a copper layer formed by electroless plating, may only be a copper layer formed by sputtering, or may be a copper layer formed by sputtering on a thin film layer such as titanium formed by sputtering.

Next, a plating resist film formation film is formed on the upper surface of the foundation metal layer 9, and this film is patterned to form a plating resist film 23. Openings 24 are formed in parts of the plating resist film 23 corresponding to regions where the upper metal layers 10 are formed. Then, electrolytic plating with copper is carried out using the foundation metal layer 9 as a plating current path, thereby forming the upper metal layers 10 on the upper surfaces of the parts of the foundation metal layer 9 in the openings 24 of the plating resist film 23. Subsequently, the plating resist film 23 is removed.

Figure 4:
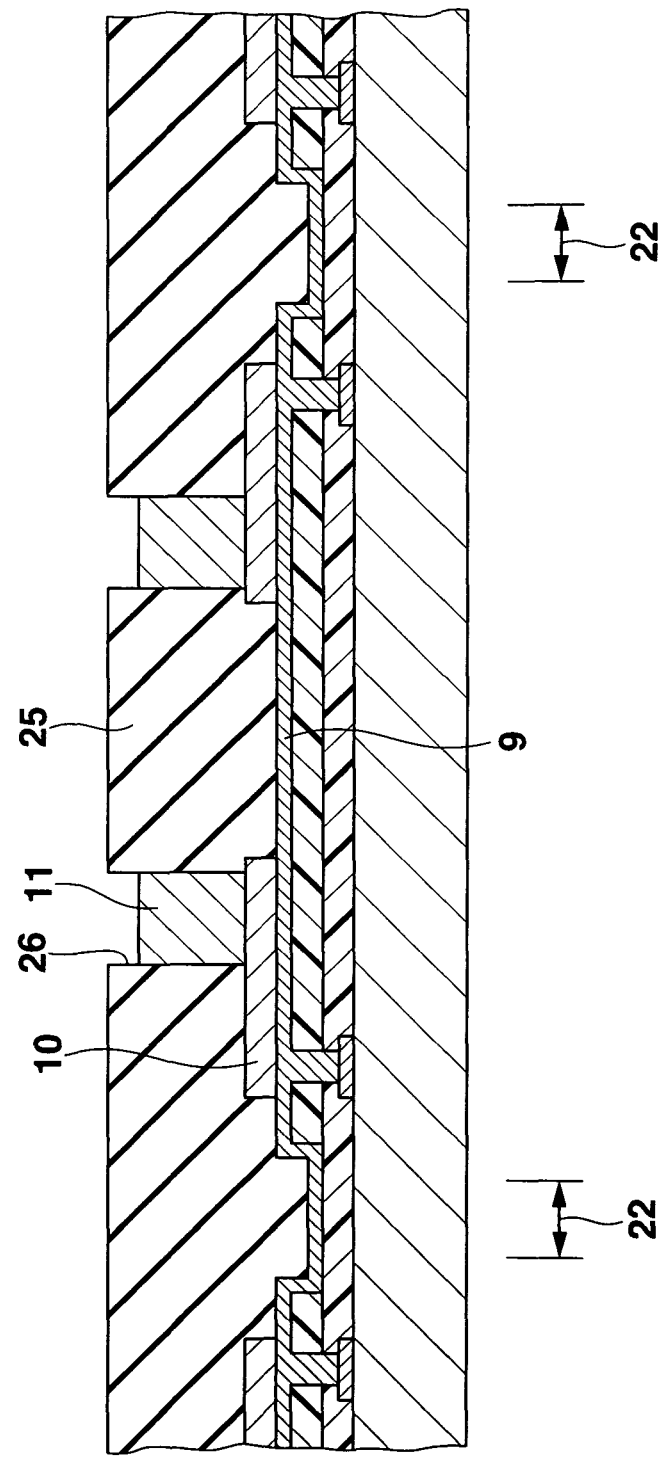
FIG. 4 is a sectional view in a step following FIG. 3.

Next, as shown in FIG. 4, a plating resist film formation film is formed on the upper surfaces of the upper metal layers 10 and the foundation metal layer 9, and this film is patterned to form a plating resist film 25. In this case, openings 26 are formed in parts of the plating resist film 25 corresponding to regions where connection pad portions of the upper metal layers 10, that is, the columnar electrodes 11 are formed. Then, electrolytic plating with copper is carried out using the foundation metal layer 9 as a plating current path, such that the columnar electrodes 11 are formed on the respective upper surfaces of the connection pad portions of the upper metal layers 10 in the openings 26 of the plating resist film 25.

Figure 5:
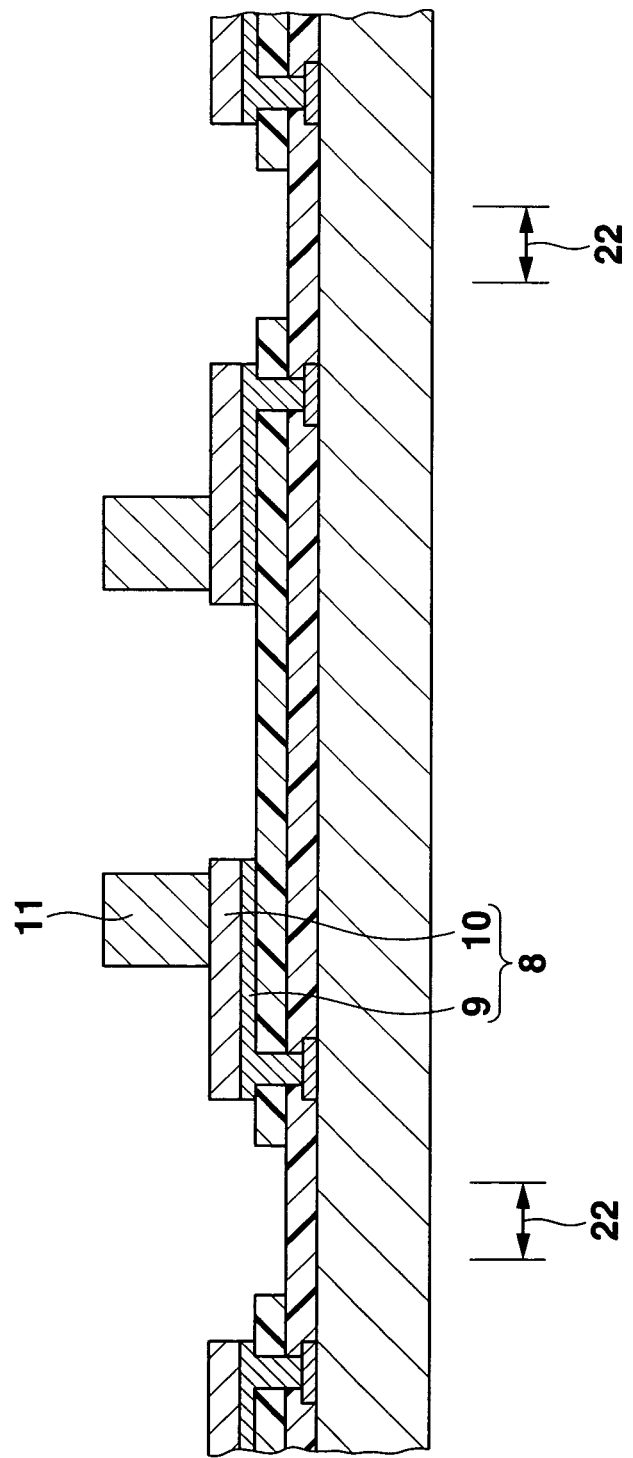
FIG. 5 is a sectional view in a step following FIG. 4.

Next, the plating resist film 25 is removed, and then the upper metal layers 10 are used as masks to etch and remove the foundation metal layer 9 in regions which are not under the upper metal layers 10. Consequently, the foundation metal layer 9 remains under the upper metal layers 10 alone, as shown in FIG. 5. In this state, the wiring lines 8 are formed by the foundation metal layer 9 and the upper metal layer 10 formed on the upper surface of the foundation metal layer 9.

Figure 6:
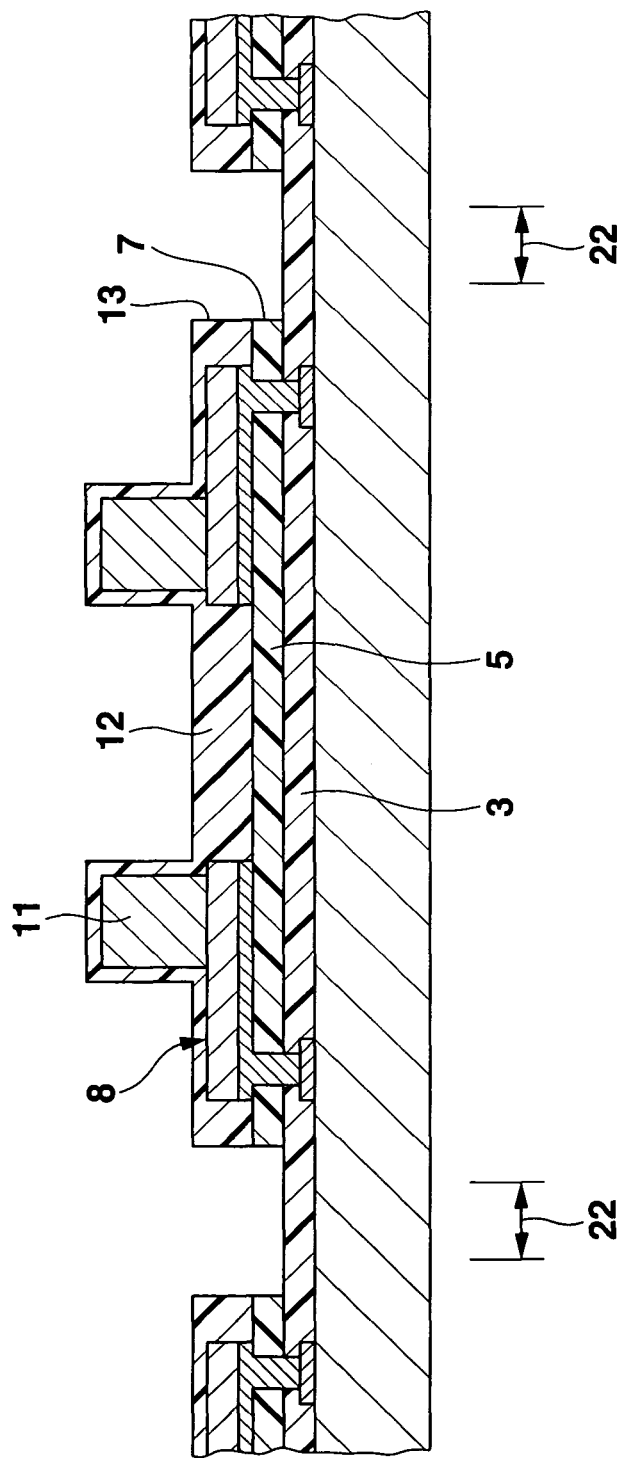
FIG. 6 is a sectional view in a step following FIG. 5.

Next, the electromigration prevention film 12 made of, for example, a polyimide resin or PBO resin is formed by a suitable method, for example, a spin coat method on the surfaces of the wiring lines 8, on the outer peripheral surfaces (upper surfaces and outer peripheral side surfaces) of the columnar electrodes 11 and on the upper surface of the protective film 5. Then, as shown in FIG. 6, the recesses 13 are formed by a photolithographic method in the parts of the electromigration prevention film 12 corresponding to the recesses 7 of the protective film 5.

Figure 7:
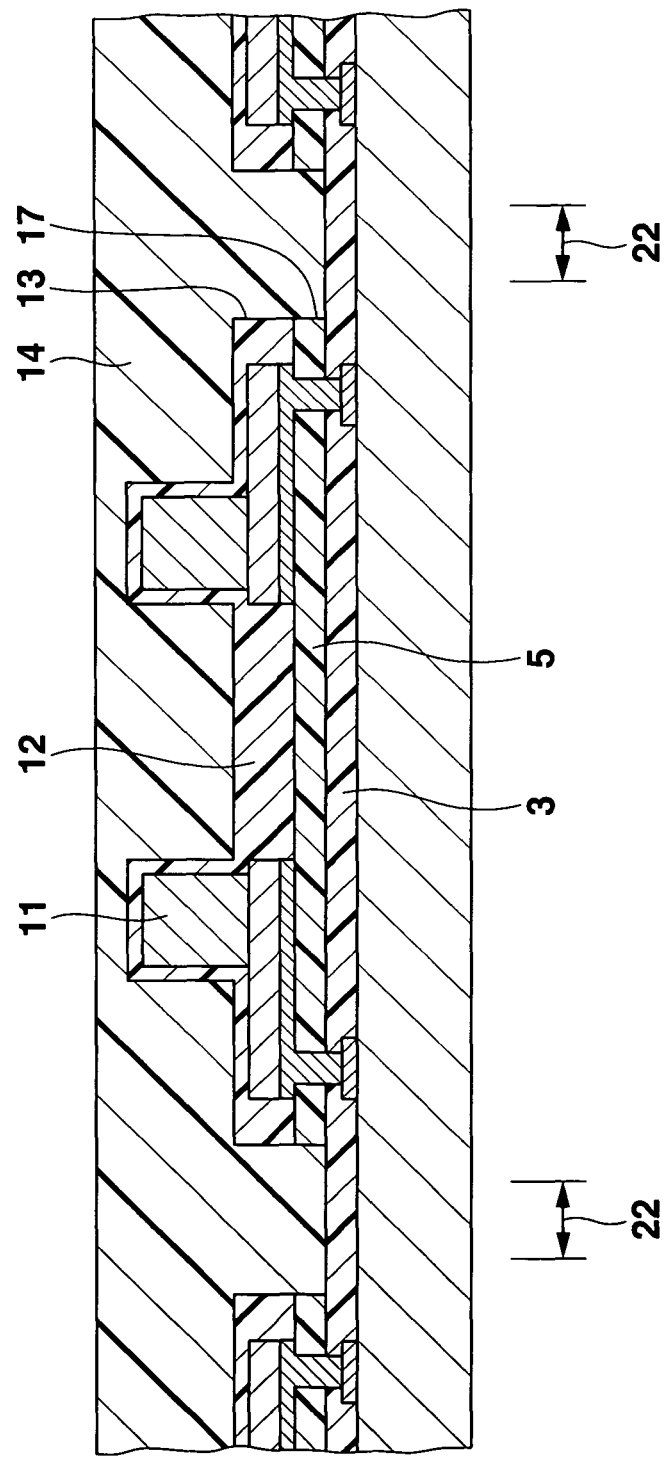
FIG. 7 is a sectional view in a step following FIG. 6.

Next, as shown in FIG. 7, the sealing film 14 made of an epoxy resin containing fillers made of, for example, silica is formed by, for example, a screen printing method or spin coat method on the upper surface of the insulating film 3 and the upper surface of the electromigration prevention film 12 exposed via the recesses 7, 13 of the protective film 5 and the electromigration prevention film 12 so that the thickness of this sealing film 14 may be greater than the height of the columnar electrode 11 (including the thickness of the part of the electromigration prevention film 12 which is formed on the upper surface of the columnar electrode 11).

Figure 8:
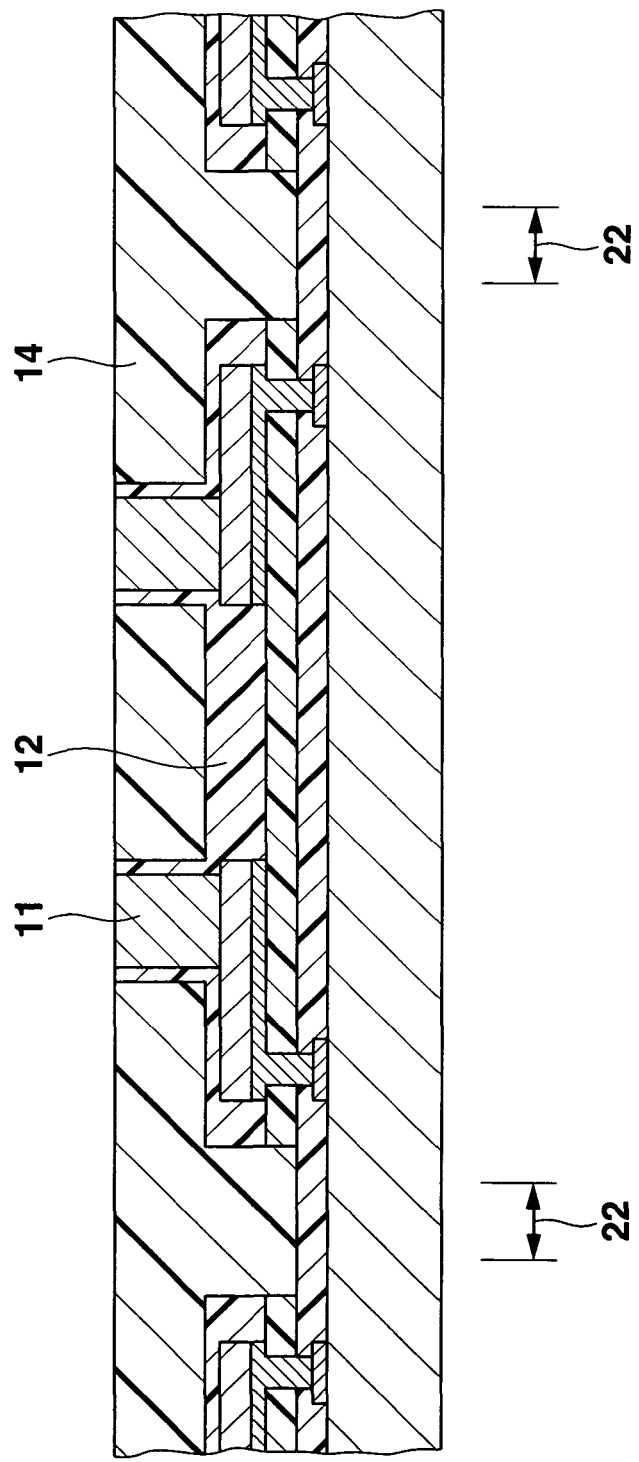
FIG. 8 is a sectional view in a step following FIG. 7.

Next, the upper surface side of the sealing film 14 is properly ground and removed in order to, as shown in FIG. 8, to expose the upper surfaces of the columnar electrodes 11 and the upper surfaces of the cylindrical portions of the electromigration prevention film 12 formed on the outer peripheral surfaces of the columnar electrodes 11, and flatten the upper surface of the sealing film 14 including these exposed surfaces.

Figure 9:
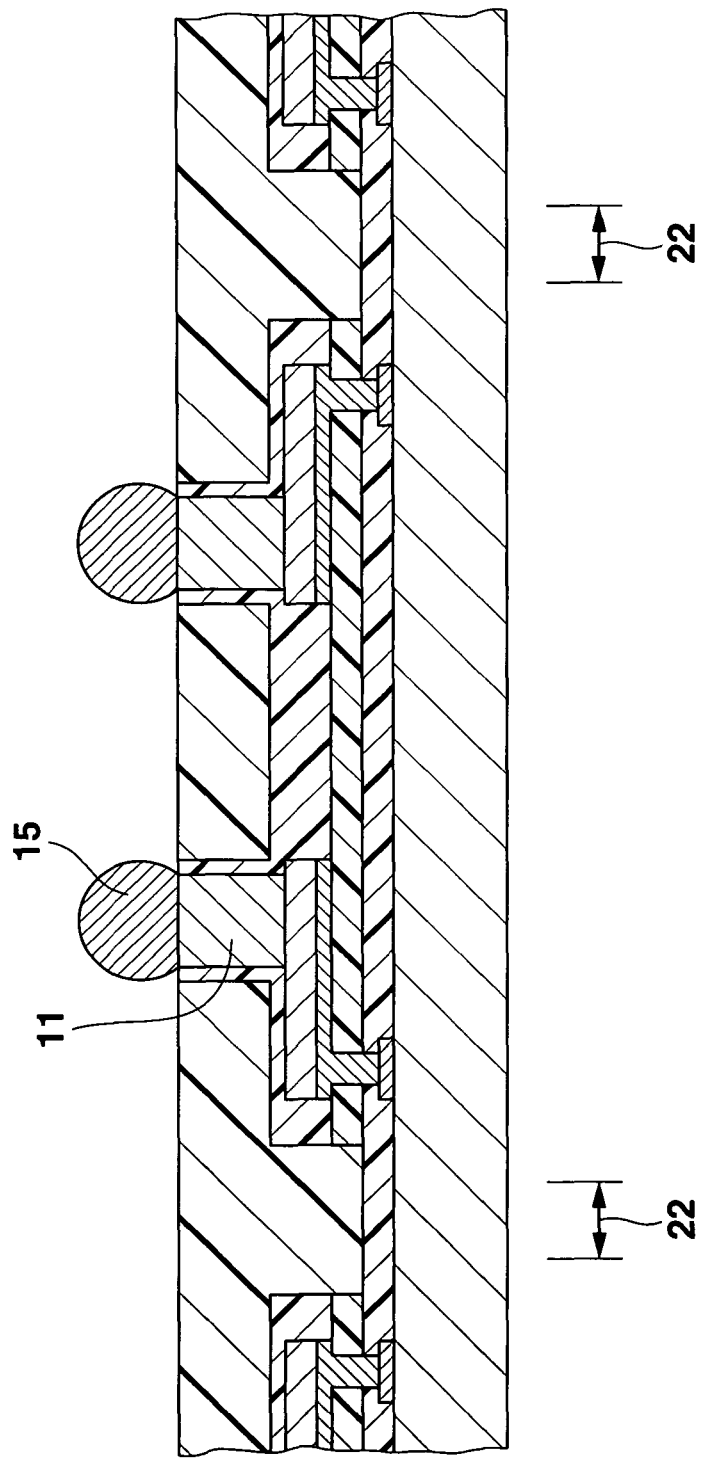
FIG. 9 is a sectional view in a step following FIG. 8.
Figure 10:
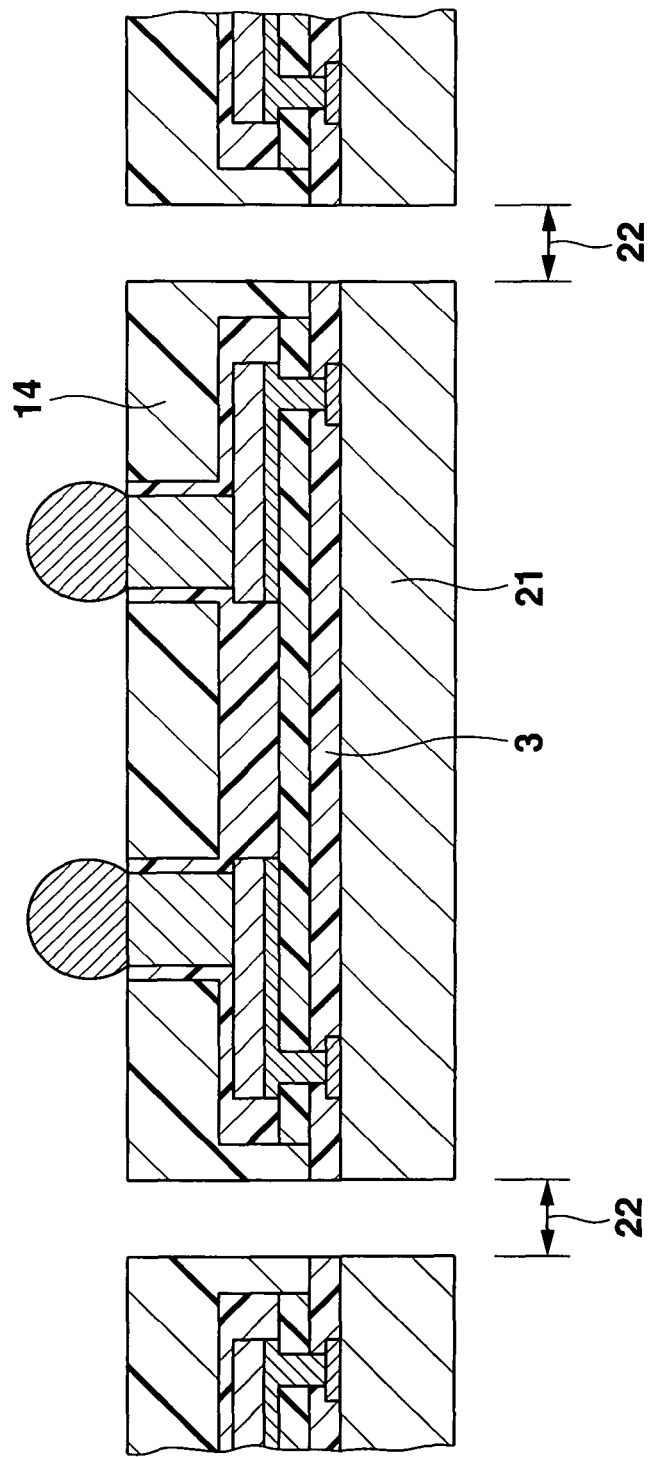
FIG. 10 is a sectional view in a step following FIG. 9.

Next, as shown in FIG. 9, the solder balls 15 are formed on the upper surfaces of the respective columnar electrodes 11. Then, as shown in FIG. 10, the semiconductor wafer 21, the insulating film 3 and the sealing film 14 are cut along the dicing lines 22, thereby obtaining a plurality of semiconductor devices shown in FIG. 1.

In the semiconductor device thus obtained, the surfaces (upper surfaces and side surfaces) of the wiring lines 8 and the outer peripheral surfaces of the columnar electrodes 11 are covered with the electromigration prevention film 12 made of, for example, a polyimide resin or PBO resin, as shown in FIG. 1. Therefore, there is no generation of electromigration between the wiring lines 8, and thus a short circuit due to the electromigration of the wiring lines 8 can be prevented.

Furthermore, in the semiconductor device shown in FIG. 1, the surfaces of the wiring lines 8 are covered with the electromigration prevention film 12 made of, for example, a polyimide resin or PBO resin, so that the wiring lines 8 are not easily mechanically damaged by fillers even if an epoxy resin containing the fillers made of, for example, silica is used as the material of the sealing film 14.

In the semiconductor device shown in FIG. 1, the entire outer peripheral surfaces of the columnar electrodes 11 are covered with the electromigration prevention film 12, and the solder balls 15 are only provided on the upper surfaces of the columnar electrodes 11, so that the upper surfaces of the cylindrical portions of the electromigration prevention film 12 covering the outer peripheral surfaces of the columnar electrodes 11 are exposed in the upper surface of the sealing film 14. In this case, if the electromigration prevention film 12 is formed by the polyimide resin or PBO resin, the reliability of moisture resistance decreases because these resins have hygroscopicity. Therefore, a second embodiment of this invention which can improve the moisture resistance reliability will next be described.

Second Embodiment

Figure 11:
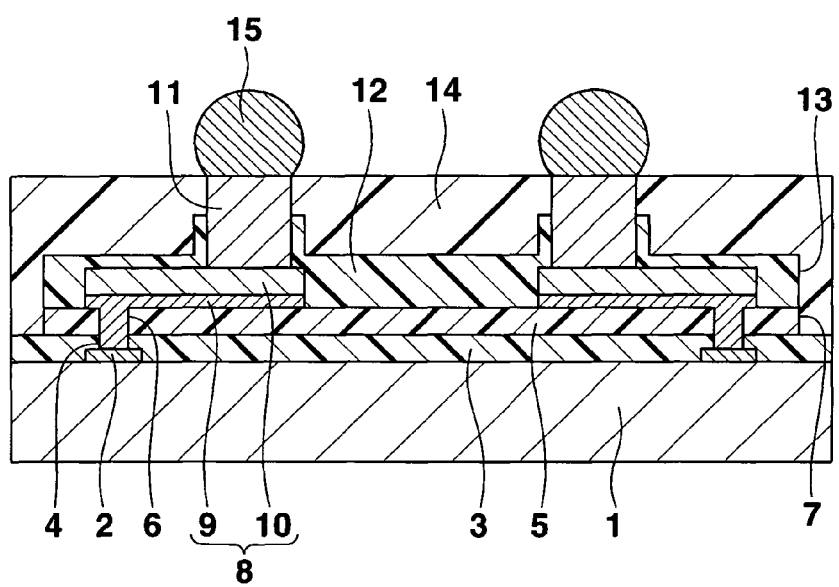
FIG. 11 is a sectional view of a semiconductor device as a second embodiment of this invention.

FIG. 11 shows a sectional view of a semiconductor device as a second embodiment of this invention. This semiconductor device is different from the semiconductor device shown in FIG. 1 in that the lower outer peripheral surface of a columnar electrode 11 is covered with an electromigration prevention film 12, and that the upper outer peripheral surface of the columnar electrode 11 is covered with a sealing film 14 so that the upper surfaces of the cylindrical portions of the electromigration prevention film 12 are not exposed in the upper surface of the sealing film 14.

Figure 12:
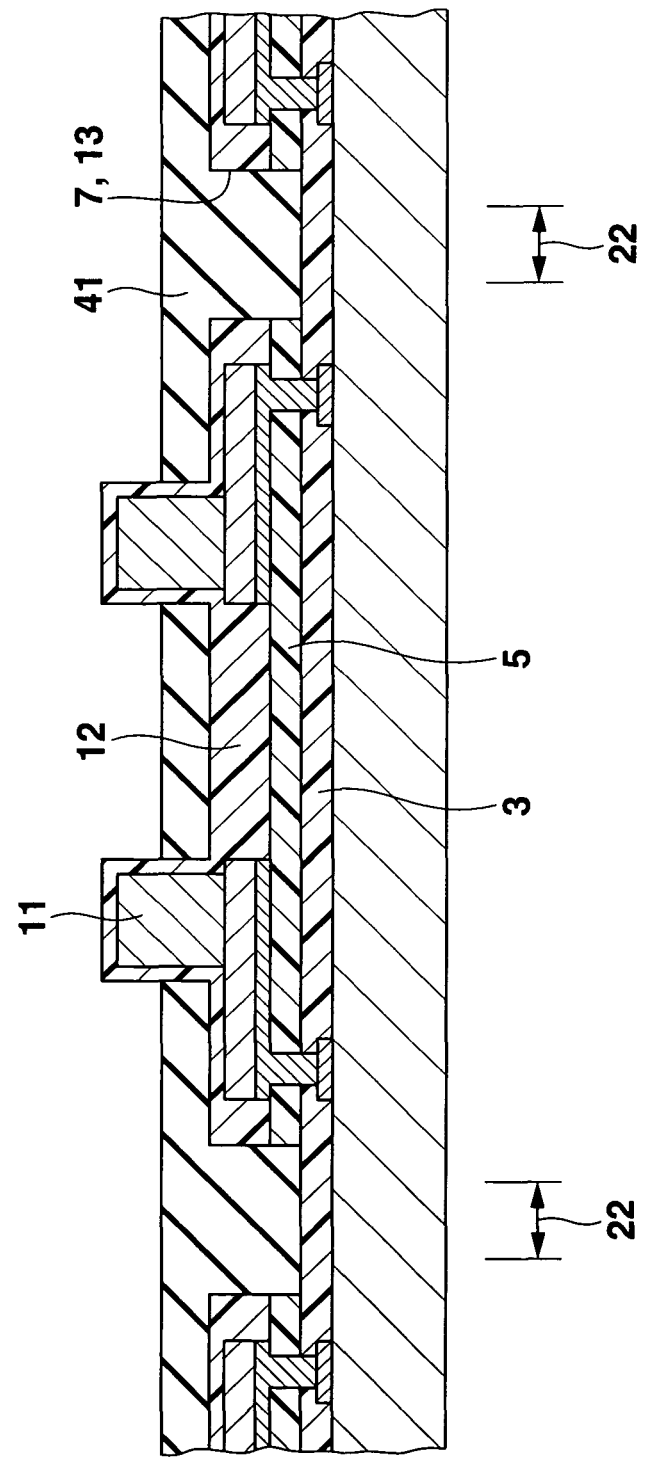
FIG. 12 is a sectional view in a predetermined step in one example of a method of manufacturing the semiconductor device shown in FIG. 11.

Next, one example of a method of manufacturing this semiconductor device will be described. In this case, after the step shown in FIG. 6, a resist film 41 is formed by, for example, a spin coat method on the upper surface of an insulating film 3 exposed by recesses or grooves 7, 13 of a protective film 5 and the electromigration prevention film 12 and on the upper surfaces of parts of the electromigration prevention film 12 except for the tops of the cylindrical portions of the electromigration prevention film 12 formed on the outer peripheral surfaces of the columnar electrodes 11, as shown in FIG. 12. In this case, the thickness of the part of the resist film 41 formed on the upper surface of the electromigration prevention film 12 is nearly half the height of the columnar electrode 11.

Figure 13:
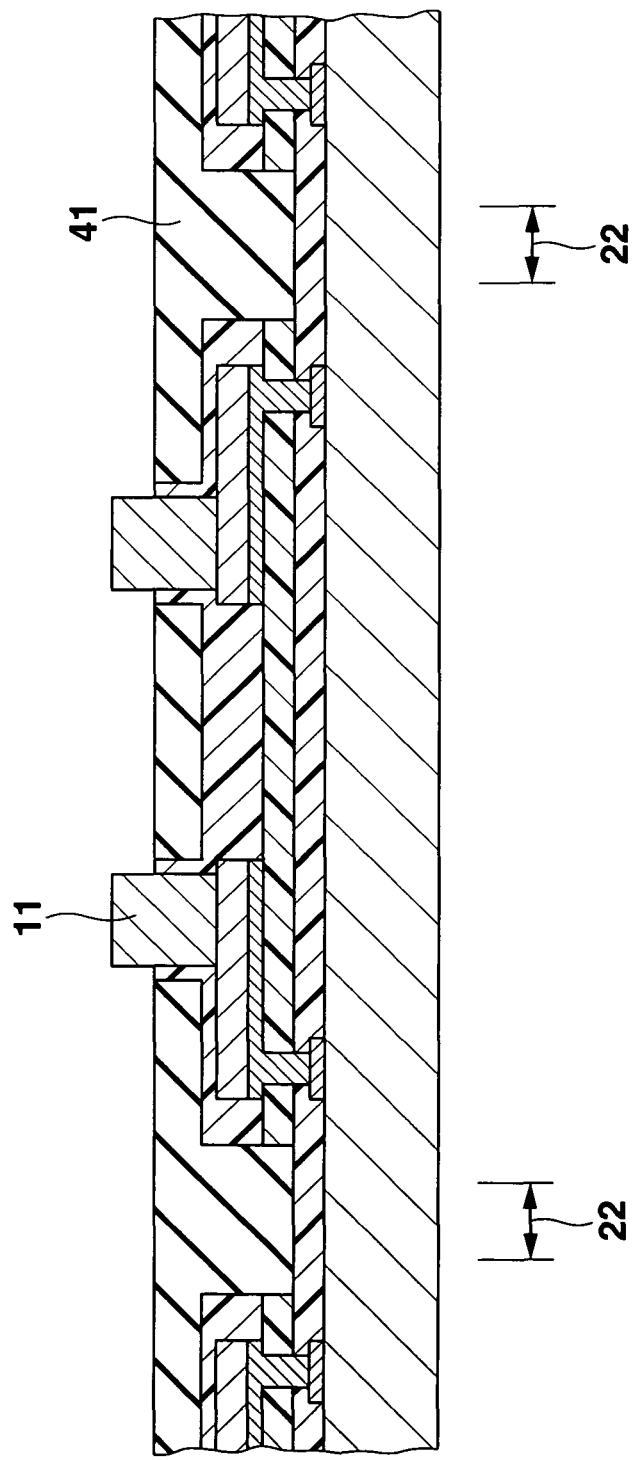
FIG. 13 is a sectional view in a step following FIG. 12.

Next, the cylindrical portions of the electromigration prevention film 12 which are formed on the upper outer peripheral surfaces of the columnar electrodes 11 projecting higher than the upper surface of the resist film 41 are etched and removed, such that the upper outer peripheral surfaces of the columnar electrodes 11 projecting higher than the upper surface of the resist film 41 are exposed, as shown in FIG. 13. Subsequently, as in the manufacturing method in the first embodiment described above, a plurality of semiconductor devices having a structure in which the upper outer peripheral surfaces of the columnar electrodes 11 are covered with the sealing film 14 are obtained as shown in FIG. 11 by a sealing film forming step, a solder ball forming step and a dicing step.

In the semiconductor device thus obtained, the upper outer peripheral surfaces of the columnar electrodes 11 and thus the upper surfaces of the cylindrical portions of the electromigration prevention film 12 are covered with the sealing film 14 made of an epoxy resin impervious to water, as shown in FIG. 11, such that the moisture resistance reliability can be improved. In this case, the moisture resistance reliability can also be improved when the sealing film 14 is formed of an epoxy resin containing fillers made of, for example, silica.

Third Embodiment

Figure 14:
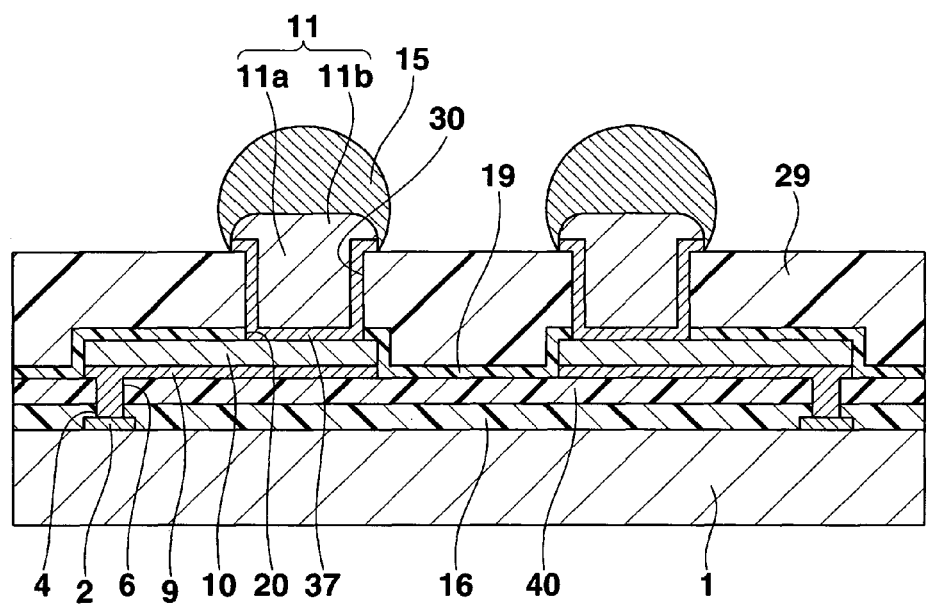
FIG. 14 is a sectional view of a semiconductor device as a third embodiment of this invention.

FIG. 14 shows a sectional view of a semiconductor device as a third embodiment of this invention. This semiconductor device is called a CSP, and comprises a silicon substrate (semiconductor substrate) 1. An integrated circuit (not shown) is provided on the upper surface of the silicon substrate 1, and a plurality of connection pads 2 made of a metal such as an aluminum-based metal are provided in peripheral parts of the upper surface of the silicon substrate 1 so that these connection pads are connected to the integrated circuit.

A first inorganic insulating film 16 made of an inorganic material containing silicon oxide or silicon nitride as the main component is provided on the upper surfaces of connection pads 2 except for the centers of the connection pads 2 and on the upper surface of the silicon substrate 1. The centers of the connection pads 2 are exposed via openings 4 provided in the first inorganic insulating film 16. An organic protective film (organic insulating film) 40 made of an organic material such as a polyimide resin or epoxy resin is provided on the upper surface of the first inorganic insulating film 16. Openings 6 are provided in parts of the organic protective film 40 corresponding to the openings 4 of the first inorganic insulating film 16.

A foundation metal layer 9 made of, for example, copper is provided on the upper surface of the organic protective film 40. An upper electrode layer 10 made of copper is provided on the entire upper surface of the foundation metal layer 9, and these layers form a wiring line 8. One end of the wiring line 8 including the foundation metal layer 9 is electrically connected to the connection pad 2 via the openings 4, 6 of the first inorganic insulating film 16 and the organic protective film 40. A second inorganic insulating film 19 made of an inorganic material containing silicon oxide or silicon nitride as the main component is provided on the upper surfaces of the wiring lines 8 and the organic protective film 40. Openings 20 are formed in parts of the second inorganic insulating film 19 corresponding to the connection pad portions of the wiring lines 8.

An overcoat film 29 made of an organic material such as a polyimide resin or epoxy resin is provided on the upper surface of the second inorganic insulating film 19. Openings 30 are formed in parts of the overcoat film 29 corresponding to the connection pad portions of the wiring lines 8. Foundation metal layers 37 made of a metal such as copper are provided on the upper surfaces of the connection pad portions of the wiring lines 8 exposed via the openings 20, 12 of the second inorganic insulating film 19 and the overcoat film 29, on the inner wall surfaces of the openings 20 of the second inorganic insulating film 19, on the inner wall surfaces of the openings 30 of the overcoat film 29, and on the upper surface of the parts of the overcoat film 29 around the openings 30 of the overcoat film 29. Columnar electrodes 11 made of copper are provided on the entire upper surfaces of the foundation metal layers 37.

Each of the columnar electrodes 11 is composed of a lower columnar electrode portion 11a provided in the openings 20, 12 of the second inorganic insulating film 19 and the overcoat film 29, and an upper columnar electrode portion 11b provided on the upper surface and periphery of the lower columnar electrode portion 11a and on the overcoat film 29. The lower columnar electrode portions 11a of the columnar electrodes 11 are electrically connected to the respective connection pad portions of the wiring lines 8 via parts of the foundation metal layers 37 provided in the openings 20, 12 of the second inorganic insulating film 19 and the overcoat film 29. A solder ball 15 is provided on the peripheral side surface of the peripheral edge of the foundation metal layer 37 provided on the upper surface of the overcoat film 29 and on the surface of the upper columnar electrode portion 11b of the columnar electrode 11.

Figure 15:
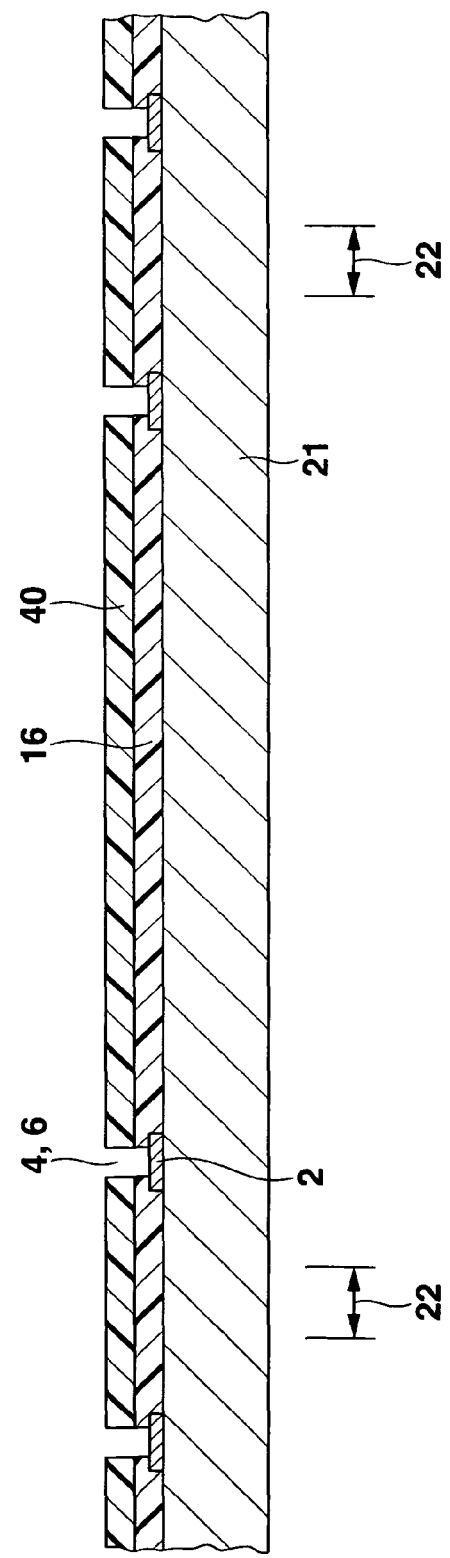
FIG. 15 is a sectional view of an initially prepared assembly in one example of a method of manufacturing the semiconductor device shown in FIG. 14.

Next, one example of a method of manufacturing this semiconductor device will be described. First, as shown in FIG. 15, an assembly is prepared wherein: the connection pads 2 made of, for example, the aluminum-based metal, the first inorganic insulating film 16 made of an inorganic material containing silicon oxide or silicon nitride as the main component, and the organic protective film 40 made of an organic material such as a polyimide resin or epoxy resin are formed on the upper surface of the silicon substrate (hereinafter referred to as a semiconductor wafer 21) in a wafer state; and the centers of the connection pads 2 are exposed via the openings 4, 6 formed in the first inorganic insulating film 16 and the organic protective film 40.

In this case, integrated circuits (not shown) with a predetermined function are formed in regions on the upper surface of the semiconductor wafer 21 where the semiconductor devices are formed, and the connection pads 2 are electrically connected to the integrated circuits formed in corresponding parts. In FIG. 15, regions indicated by a numeral 22 correspond to dicing lines.

Figure 16:
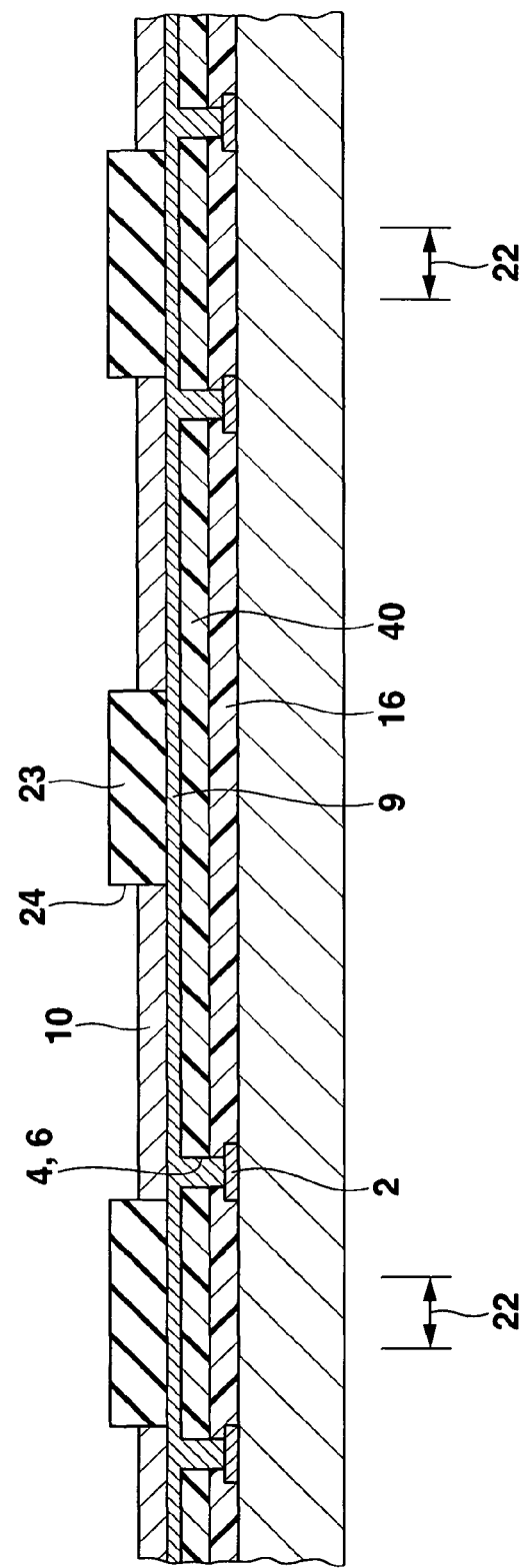
FIG. 16 is a sectional view in a step following FIG. 15.

Next, as shown in FIG. 16, a layer for forming the foundation metal layer 9 (hereinafter simply referred to as the foundation metal layer 9 for simplicity) is formed on the entire upper surfaces of the parts of the connection pads 2 exposed via the openings 4, 6 in the first inorganic insulating film 16 and the organic protective film 40 and on the entire upper surface of the organic protective film 40. In this case, the foundation metal layer 9 may only be a copper layer formed by electroless plating, may only be a copper layer formed by sputtering, or may be a copper layer formed by sputtering on a thin film layer such as titanium formed by sputtering.

Figure 17:
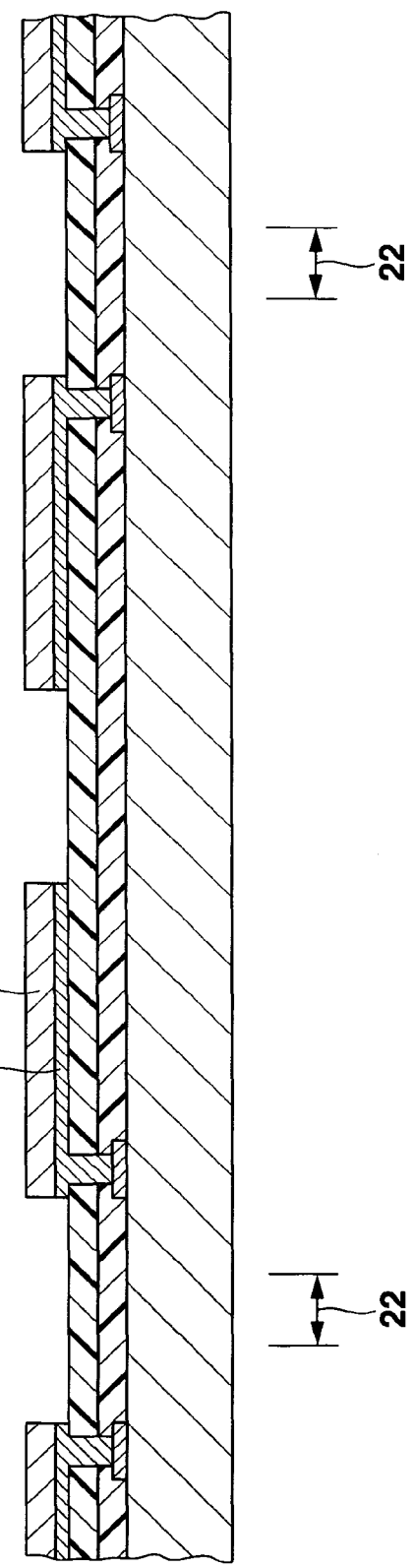
FIG. 17 is a sectional view in a step following FIG. 16.

Next, a plating resist film 23 is patterned/formed on the upper surface of the foundation metal layer 9. In this case, openings 24 are formed in parts of the plating resist film 23 corresponding to regions where the wiring lines 8 (the upper electrode layers 10) are formed. Then, electrolytic plating with copper is carried out using the foundation metal layer 9 as a plating current path, thereby forming a layer for forming a upper metal layer of the wiring line 8 (hereinafter simply referred to as an upper metal layer for simplicity) is formed on the upper surface of the foundation metal layer 9 in the opening 24 of the plating resist film 23. Subsequently, the plating resist film 23 is released, and then the foundation metal layer 9 in regions which are not under the upper metal layer is etched and removed using the upper metal layer as a mask, whereby the foundation metal layer 9 remains under the upper metal layer alone, as shown in FIG. 17.

Figure 18:
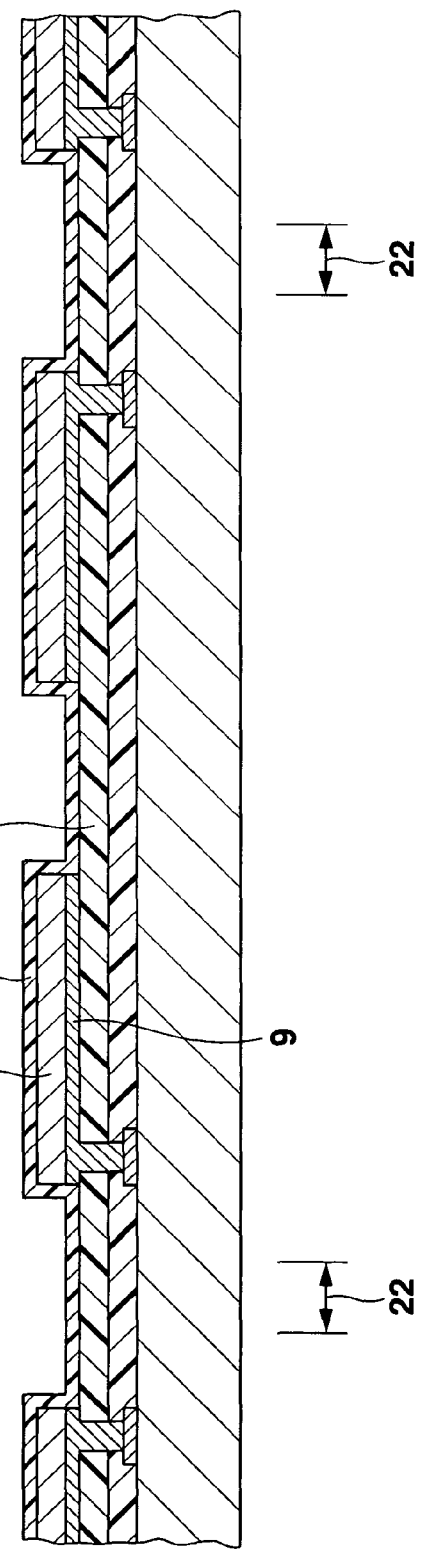
FIG. 18 is a sectional view in a step following FIG. 17.

Next, as shown in FIG. 18, the second inorganic insulating film 19 made of an inorganic material containing silicon oxide or silicon nitride as the main component is formed on the upper surfaces of the wiring lines 8 and the organic protective film 40 by a plasma CVD method. In this case, the process temperature in forming the second inorganic insulating film 19 is preferably 250° C. or less so that the already formed organic protective film 40 made of an organic material such as a polyimide resin is not thermally damaged.

For example, if $Si(OH_2H_5)_4$(TEOS) is used as a process gas, an $SiO_2$ film having a thickness of 500 to 1000 nm can be formed in 10 to 20 minutes at a process temperature of about 120° C. If $SiH(OCH_3)_3$(TMS) is used as a process gas, an $SiO_2$ film having a thickness of 500 to 1000 nm can be formed in 10 to 20 minutes at a process temperature of about 80° C.

Figure 19:
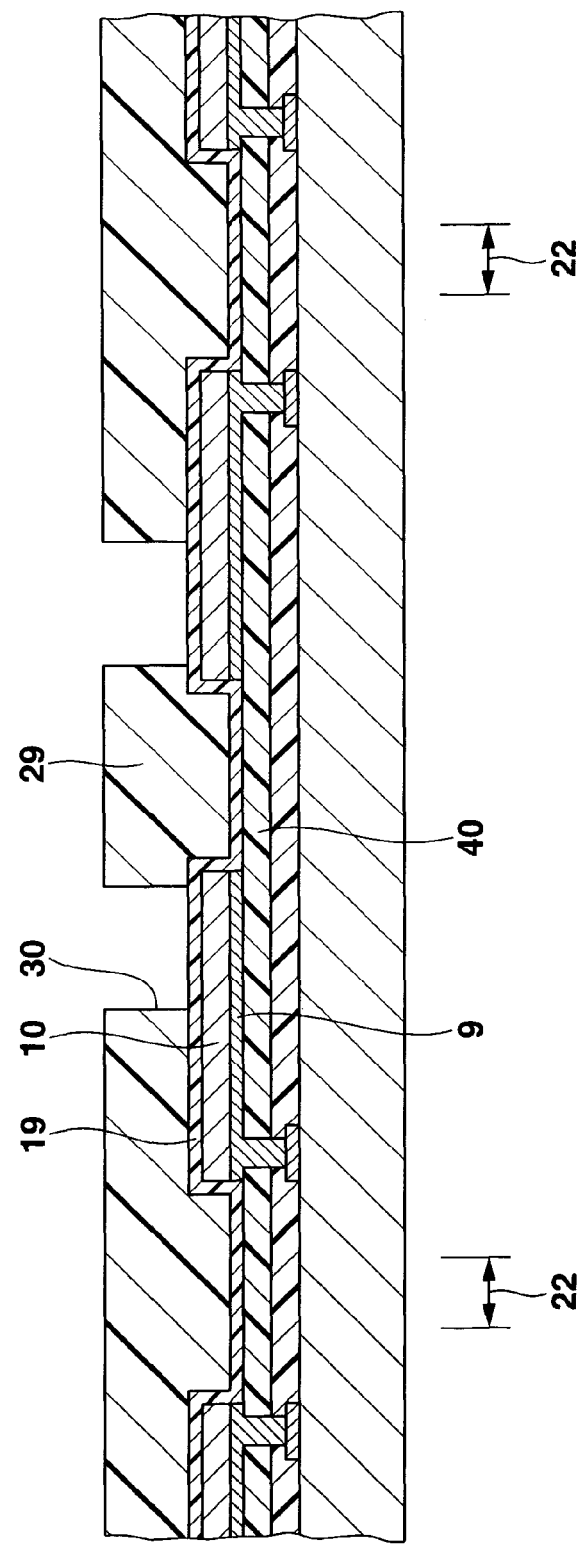
FIG. 19 is a sectional view in a step following FIG. 18.

Next, as shown in FIG. 19, the overcoat film 29 made of an organic material such as a polyimide resin or epoxy resin is formed by, for example, a spin coat method on the upper surface of the second inorganic insulating film 19. Then, the openings 30 are formed in the respective parts of the overcoat film 29 corresponding to the connection pad portions of the wiring lines 8 by a photolithographic method using a photomask (not shown).

Figure 20:
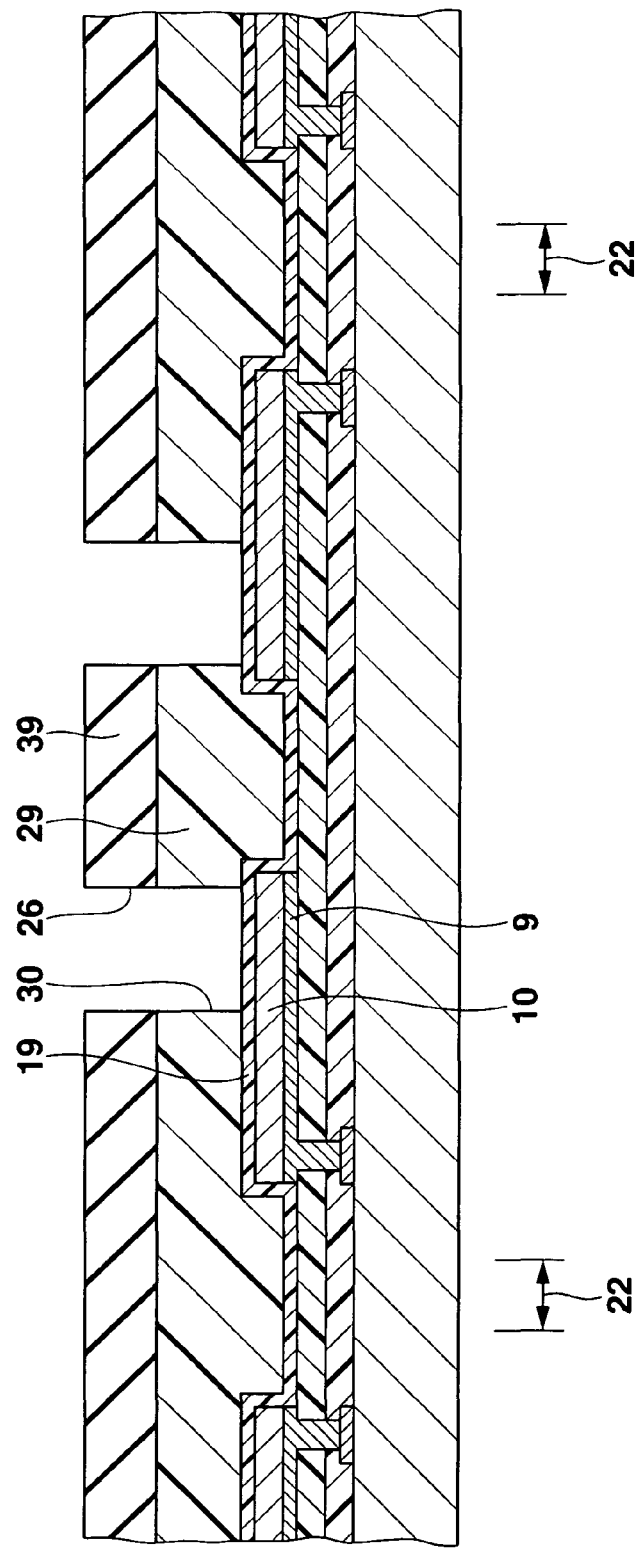
FIG. 20 is a sectional view in a step following FIG. 19.

Next, as shown in FIG. 20, a positive resist film 39 made of, for example, a novolak resin is patterned/formed on the upper surface of the overcoat film 29. In this case, openings 26 are formed in parts of the resist film 39 corresponding to the openings 30 of the overcoat film 29 (i.e., the connection pad portions of the wiring lines 8).

Figure 21:
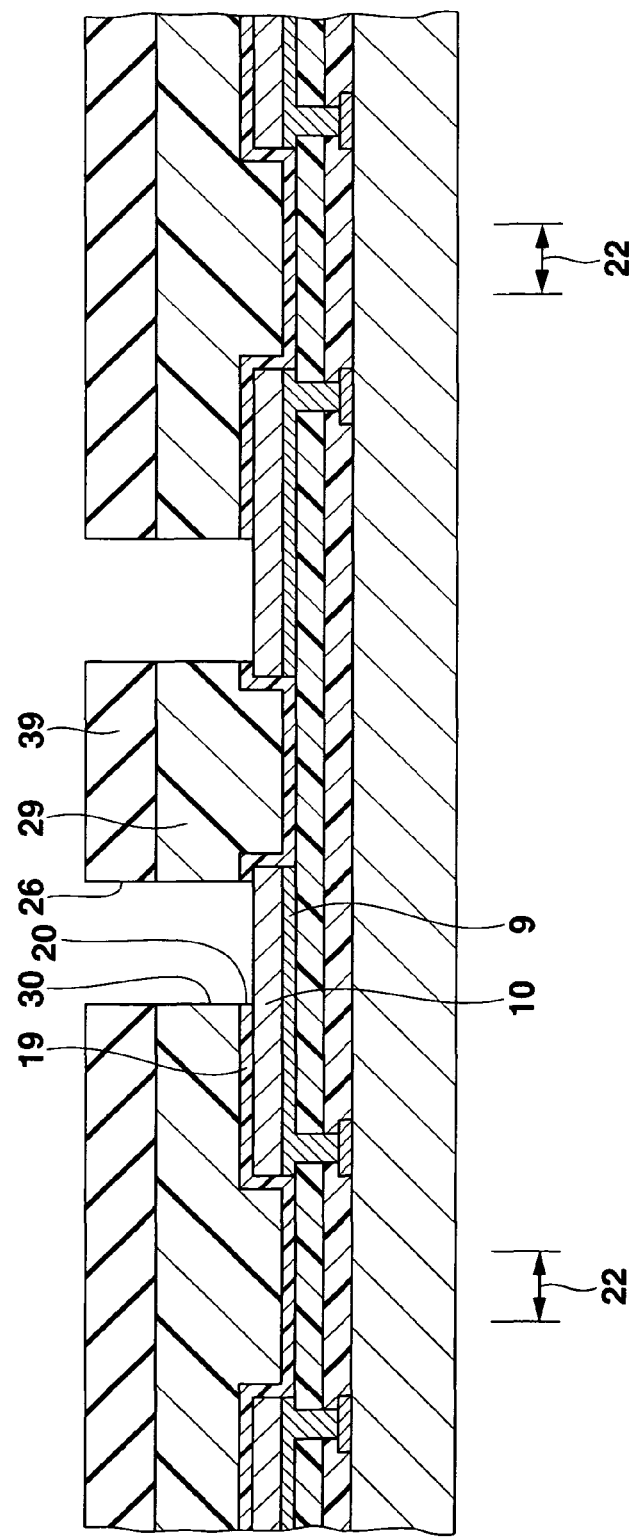
FIG. 21 is a sectional view in a step following FIG. 20.

Next, the second inorganic insulating film 19 is subjected to dry etching using the resist film 39 as a mask in order to form the openings 20 in parts of the second inorganic insulating film 19 corresponding to the openings 30 of the overcoat film 29 (i.e., the connection pad portions of the wiring lines 8), as shown in FIG. 21. In this case, the dry etching may be, for example, general reactive ion etching (RIE) or may be high-density plasma dry etching described later.

Next, the resist film 39 is released. In addition, the dry etching may be carried out using the overcoat film 29 as a mask without using the resist film 39. In this case as well, the dry etching may be, for example, the general reactive ion etching (RIE) or may be the high-density plasma dry etching described later.

Figure 22:
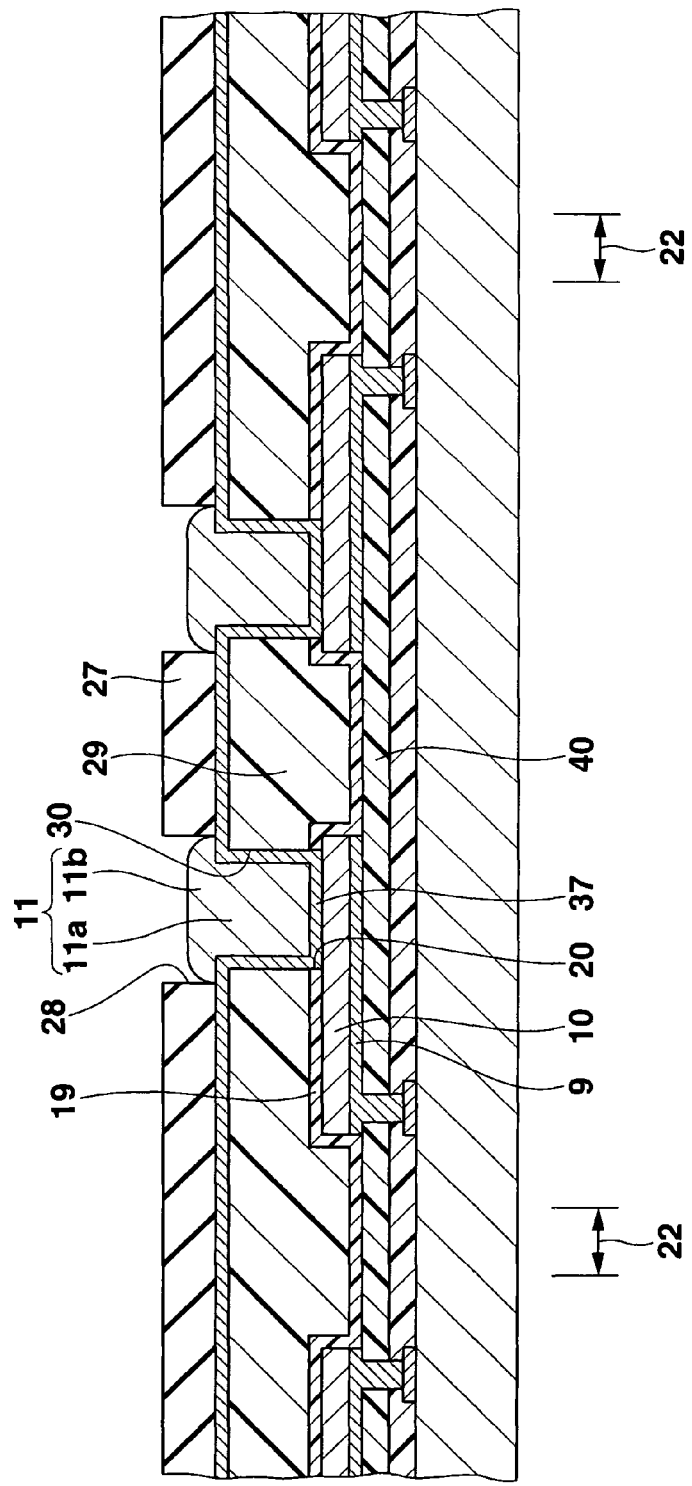
FIG. 22 is a sectional view in a step following FIG. 21.

Next, as shown in FIG. 22, the foundation metal layer 37 is formed by, for example, sputtering of copper on the upper surfaces of the connection pad portions of the wiring lines 8 exposed via the openings 20, 12 of the second inorganic insulating film 19 and the overcoat film 29 and on the entire upper surface of the overcoat film 29. Then, a plating resist film 27 is patterned/formed on the upper surface of the foundation metal layer 37. In this case, an opening 28 slightly greater than the opening 30 of the overcoat film 29 is formed in a part of the plating resist film 27 corresponding to a region where the upper columnar electrode portion 11b of the columnar electrode 11 is formed.

Next, electrolytic plating with copper is carried out using the foundation metal layer 37 as a plating current path in order to form the lower columnar electrode portions 11a in the foundation metal layer 37 of the openings 20, 12 of the second inorganic insulating film 19 and the overcoat film 29 and then form the upper columnar electrode portion 11b on the lower columnar electrode portion 11a in the opening 28 of the plating resist film 27 and on the upper surface of the foundation metal layer 37.

In this case, as the opening 28 of the plating resist film 27 is slightly greater than the opening 30 of the overcoat film 29, plating is isotropically deposited in the opening 28 of the plating resist film 27. Therefore, the upper columnar electrode portion 11b formed in the opening 28 of the plating resist film 27 has a bulging shape. Thus, the columnar electrode 11 composed of the lower columnar electrode portion 11a and the upper columnar electrode portion 11b is formed.

Figure 23:
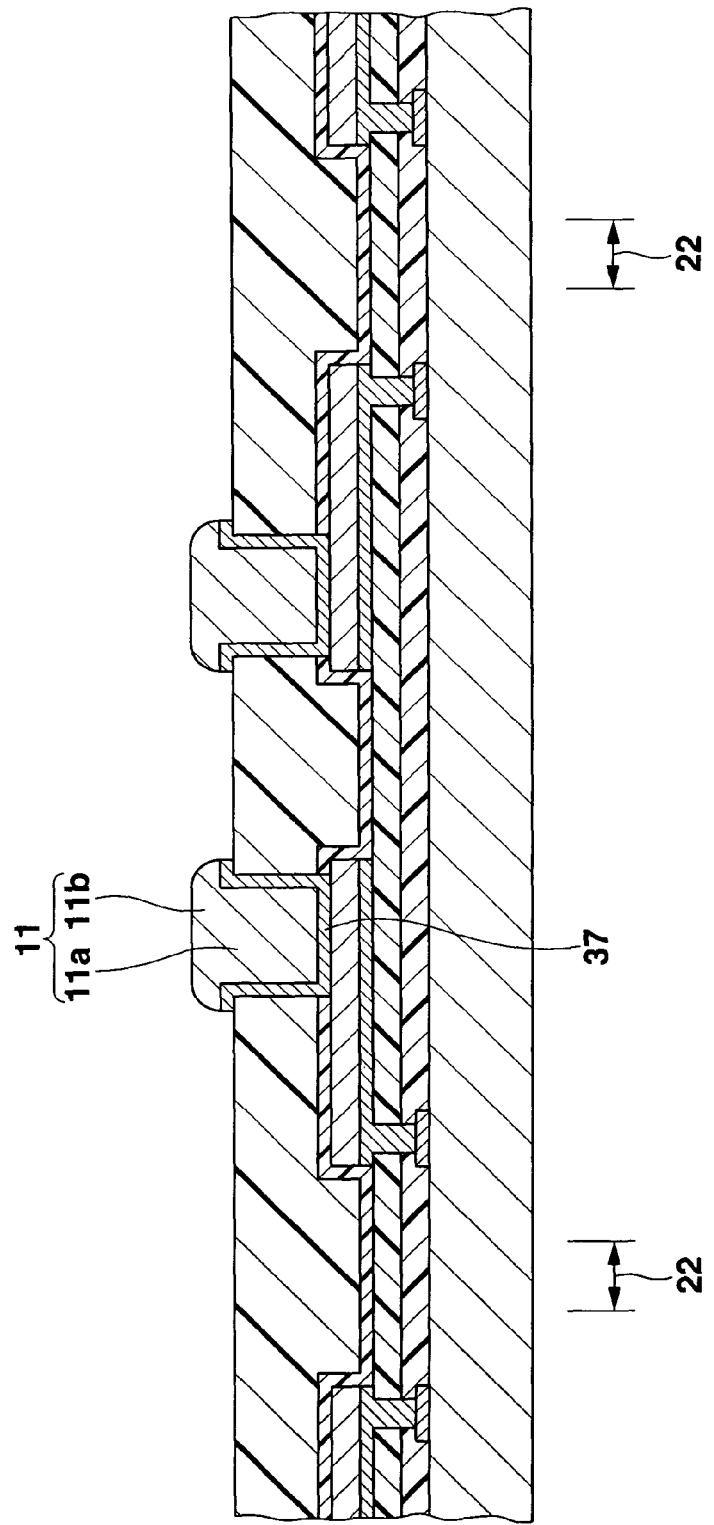
FIG. 23 is a sectional view in a step following FIG. 22.

Next, the plating resist film 27 is released, and then parts of the foundation metal layer 37 in regions which are not under the columnar electrodes 11 are etched and removed using the columnar electrodes 11 as masks, whereby the foundation metal layer 37 remains under the columnar electrodes 11 alone, as shown in FIG. 23. Subsequently, a flux (not shown) is applied onto the upper surfaces of the upper columnar electrode portions 11b of the columnar electrodes 11 by a screen printing method, and solder balls (not shown) are then mounted on the upper surface of the flux.

Figure 24:
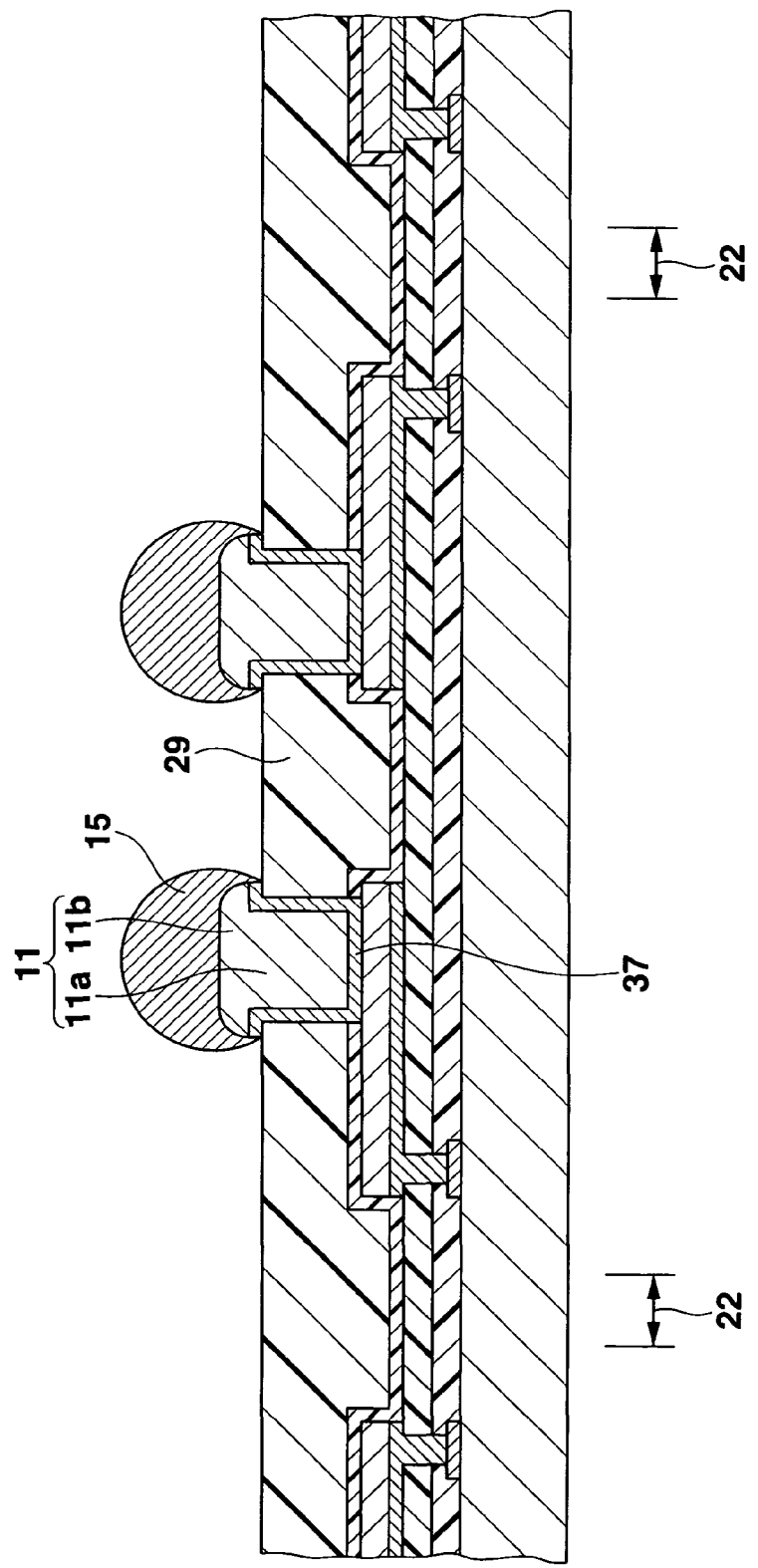
FIG. 24 is a sectional view in a step following FIG. 23.
Figure 25:
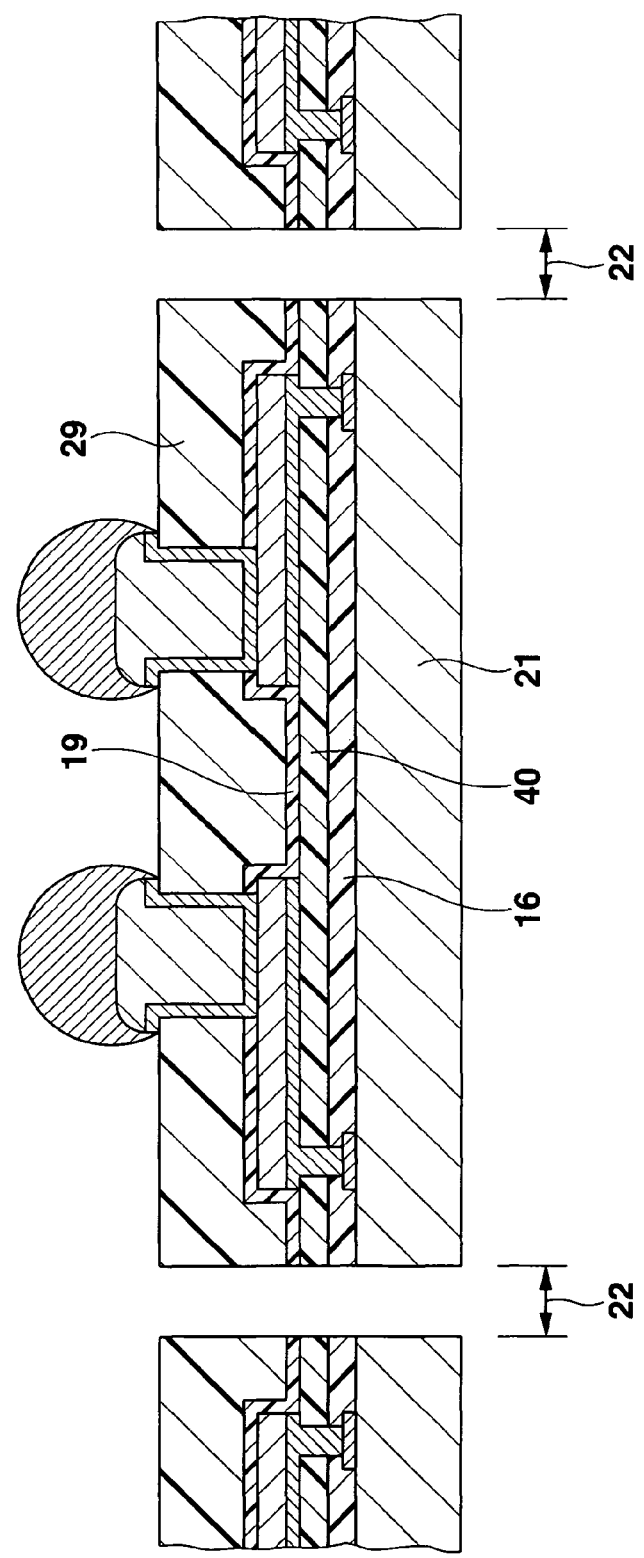
FIG. 25 is a sectional view in a step following FIG. 24.

Next, after a reflow process, the solder ball mounted on the upper surface of the flux is melted, and then rounded and solidified by surface tension, such that the solder ball 15 is formed on the surface of the upper columnar electrode portion 11b of the columnar electrode 11 including the end face of the foundation metal layer 37 formed on the upper surface of the overcoat film 29, as shown in FIG. 24. Then, as shown in FIG. 25, the semiconductor wafer 21, the first inorganic insulating film 16, the organic protective film 40, the second inorganic insulating film 19 and the overcoat film 29 are cut along the dicing lines 22, thereby obtaining a plurality of semiconductor devices shown in FIG. 14.

Here, in the semiconductor device manufacturing method described above, the second inorganic insulating film 19 having the openings 20 in the parts corresponding to the connection pad portions of the wiring lines 8 is formed on the organic protective film 40 including the wiring lines 8, and the overcoat film 29 having the openings 30 in the parts corresponding to the connection pad portions of the wiring lines 8 is formed on the second inorganic insulating film 19, and then the columnar electrode 11 is formed by electrolytic plating on the connection pad portion of the wiring line 8 in the openings 20, 12 of the second inorganic insulating film 19 and the overcoat film 29, as shown in FIG. 22, such that there is no longer a need for a special process of grinding.

Furthermore, in the semiconductor device obtained by the manufacturing method described above, the surfaces of the wiring lines 8 except for the connection pad portions are covered with the second inorganic insulating film 19 made of an inorganic material containing silicon oxide or silicon nitride as the main component as shown in FIG. 14, so that it is possible to hold down the generation of electromigration between the wiring lines 8 and between the wiring line 8 and the columnar electrode 11.

Fourth Embodiment

Figure 26:
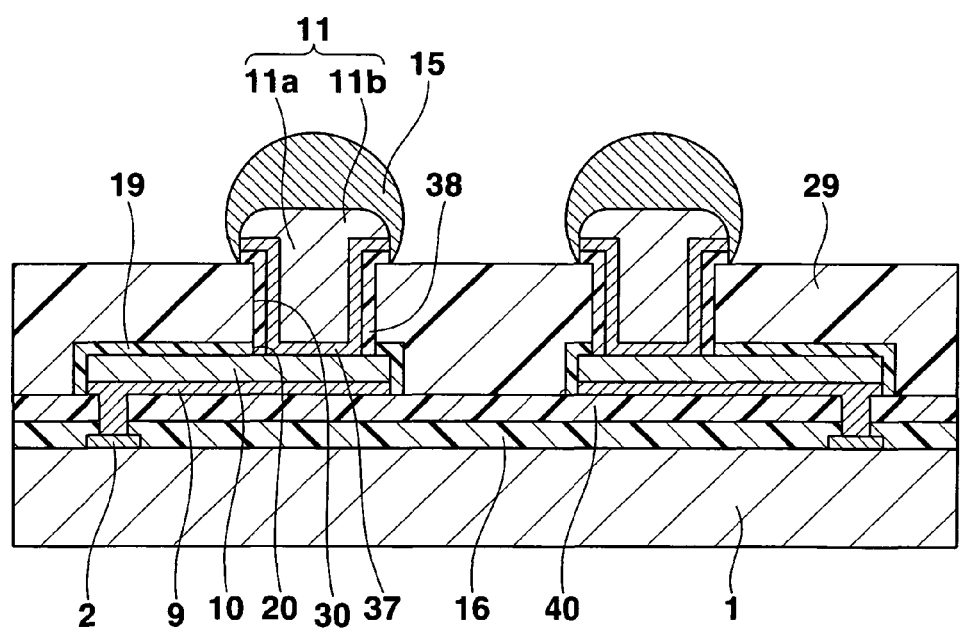
FIG. 26 is a sectional view of a semiconductor device as a fourth embodiment of this invention.

FIG. 26 is a sectional view of a semiconductor device as a fourth embodiment of this invention. This semiconductor device is different from the semiconductor device shown in FIG. 14 in that a second inorganic insulating film 19 having openings 20 is only provided on the surfaces of wiring lines 8 including a foundation metal layer 9, and that a third inorganic insulating film 38 is provided on the inner wall surfaces of the openings 20 of the second inorganic insulating film 19, on the inner wall surfaces of openings 30 of an overcoat film 29 and on the upper surface of the overcoat film 29 around the openings 30.

Figure 27:
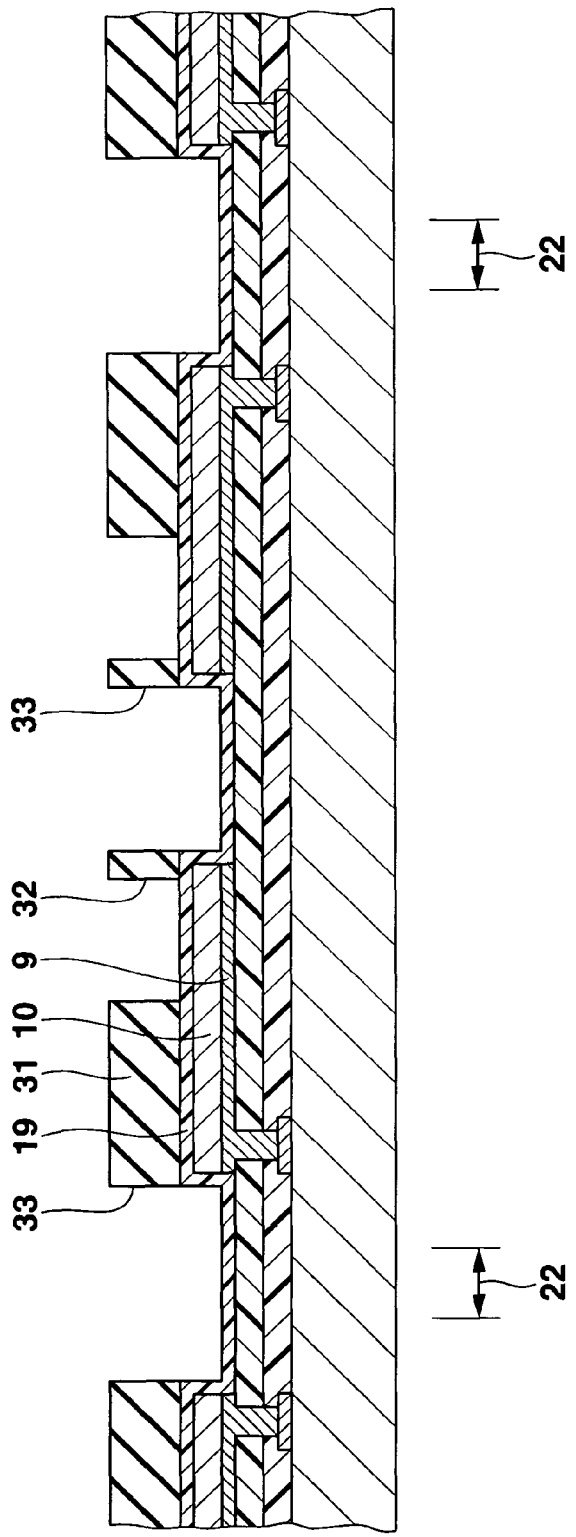
FIG. 27 is a sectional view of a predetermined step in one example of a method of manufacturing the semiconductor device shown in FIG. 26.

Next, one example of a method of manufacturing this semiconductor device will be described. In this case, after the step shown in FIG. 18, a positive resist film 31 made of, for example, a novolak resin is patterned/formed on the upper surface of the second inorganic insulating film 19, as shown in FIG. 27. In this case, first openings 32 are formed in parts of the resist film 31 corresponding to the connection pad portions of the wiring lines 8. Moreover, second openings 33 are formed in the resist film 31 corresponding to parts between the second inorganic insulating films 19 covering the end faces of the wiring lines 8.

Figure 28:
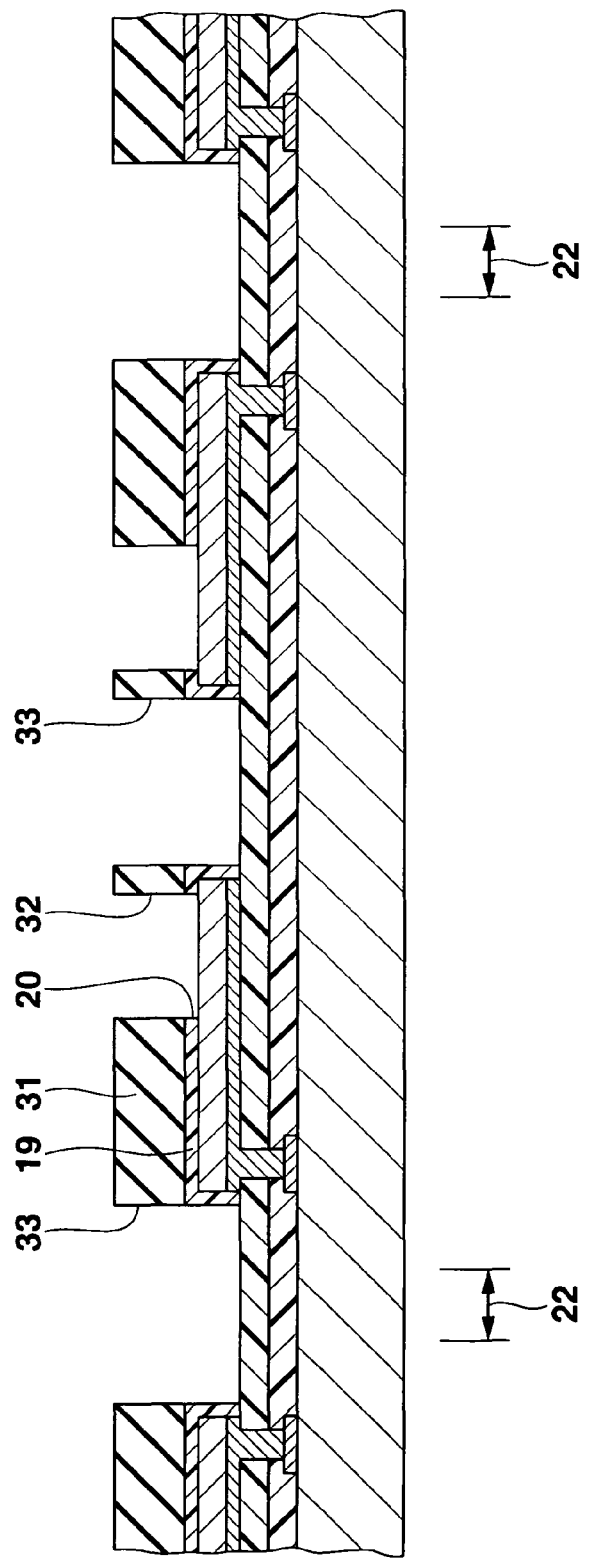
FIG. 28 is a sectional view in a step following FIG. 27.

Next, the second inorganic insulating film 19 is subjected to dry etching using the resist film 31 as a mask in order to form the openings 20 in parts of the second inorganic insulating film 19 corresponding to the first openings 32 of the resist film 31 (i.e., the connection pad portions of the wiring lines 8) and remove parts of the second inorganic insulating film 19 corresponding to the second openings 33 of the resist film 31, as shown in FIG. 28.

In this case, the dry etching may be, for example, general reactive ion etching (RIE) or may be high-density plasma dry etching described later. Moreover, in this state, the second inorganic insulating film 19 having the openings 20 is only formed on the surfaces of wiring lines 8 including the foundation metal layer 9. Then, the resist film 31 is released.

Figure 29:
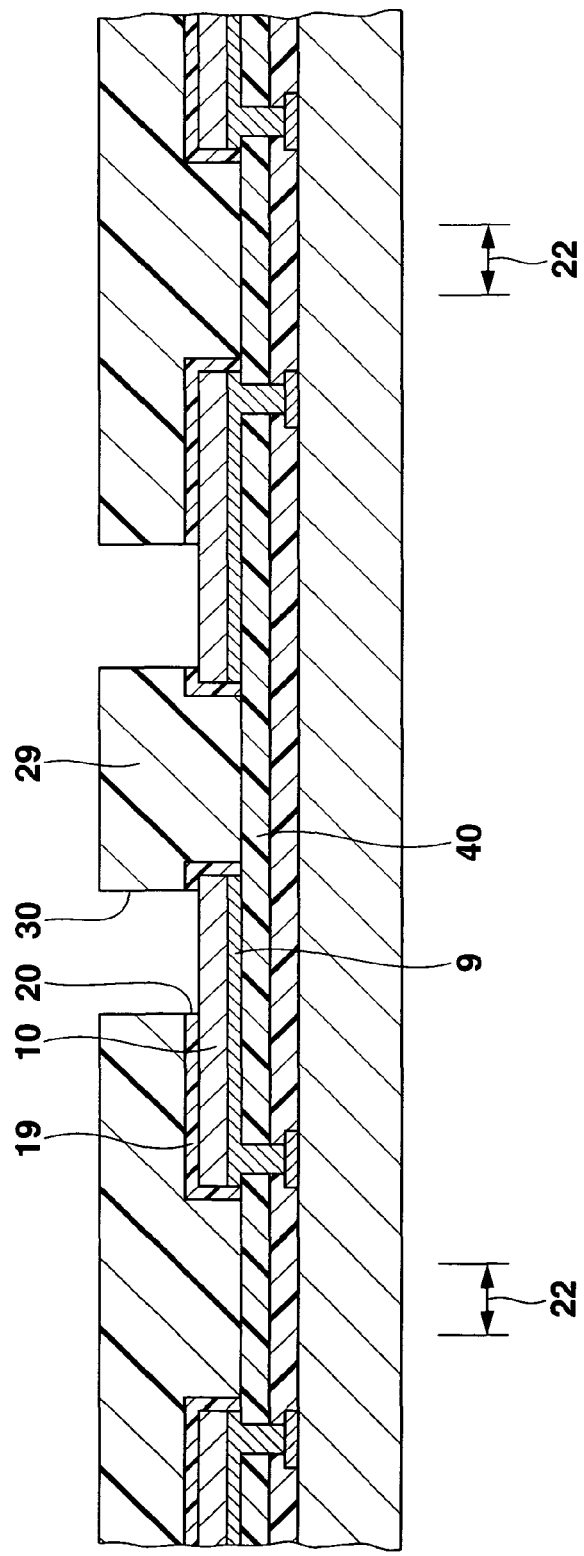
FIG. 29 is a sectional view in a step following FIG. 28.

Next, as shown in FIG. 29, the overcoat film 29 made of an organic material such as a polyimide resin or epoxy resin is patterned/formed on the upper surface of an organic protective film 40 including the second inorganic insulating film 19. In this case, the openings 30 are formed in the respective parts of the overcoat film 29 corresponding to the connection pad portions of the wiring lines 8 by a photolithographic method using a photomask (not shown).

Figure 30:
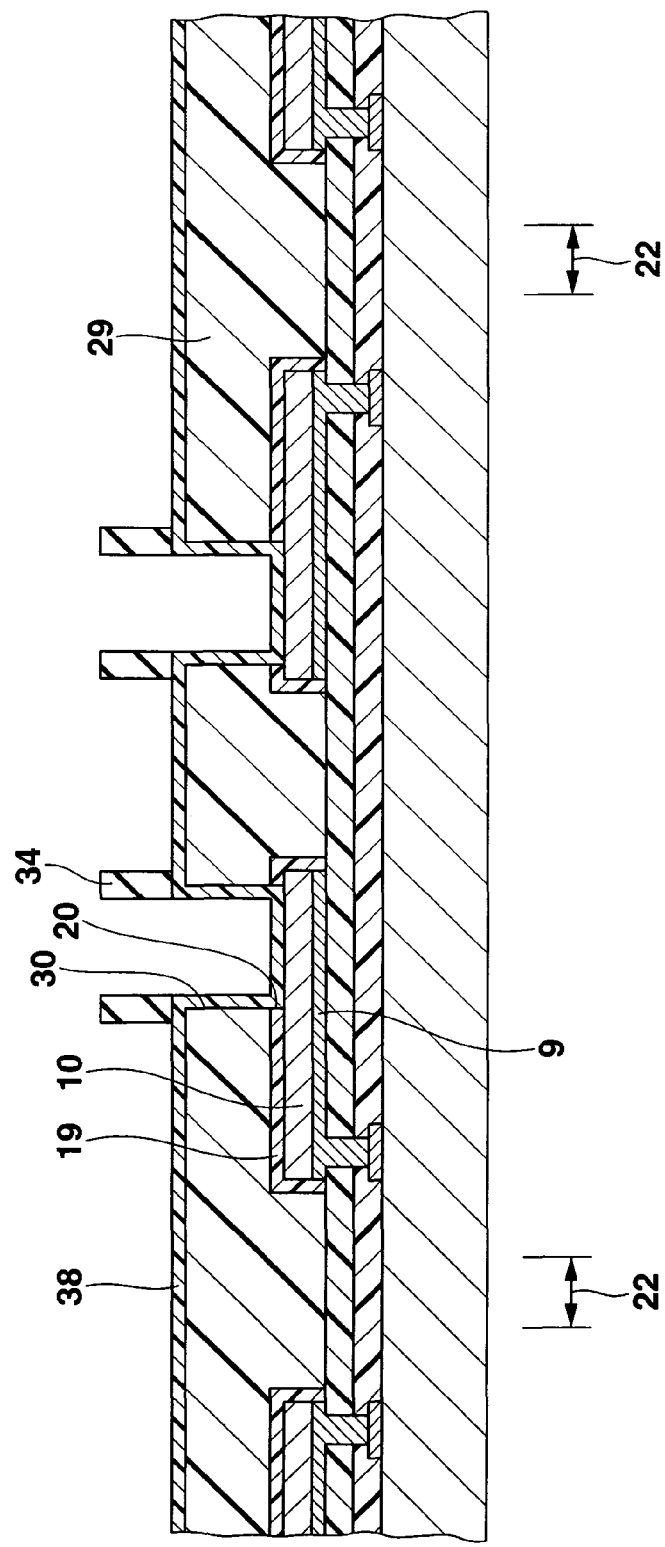
FIG. 30 is a sectional view in a step following FIG. 29.

Next, as shown in FIG. 30, the third inorganic insulating film 38 made of an inorganic material containing silicon oxide or silicon nitride as the main component is formed by a plasma CVD method on the upper surfaces of the connection pad portions of the wiring lines 8 exposed via the openings 20, 12 of the second inorganic insulating film 19 and the overcoat film 29 and on the entire upper surface of the overcoat film 29. In this case as well, the process temperature in forming the third inorganic insulating film 38 is preferably 250° C. or less so that the already formed organic protective film 40 and overcoat film 29 made of an organic material such as a polyimide resin are not thermally damaged.

Next, a positive resist film 34 made of, for example, a novolak resin is patterned/formed on the upper surface of the third inorganic insulating film 38. In this case, the positive resist film 34 is only formed on the upper surface of the third inorganic insulating film 38 formed on the inner wall surfaces of the openings 30 of the overcoat film 29, and on the upper surface of the third inorganic insulating film 38 around the openings.

Figure 31:
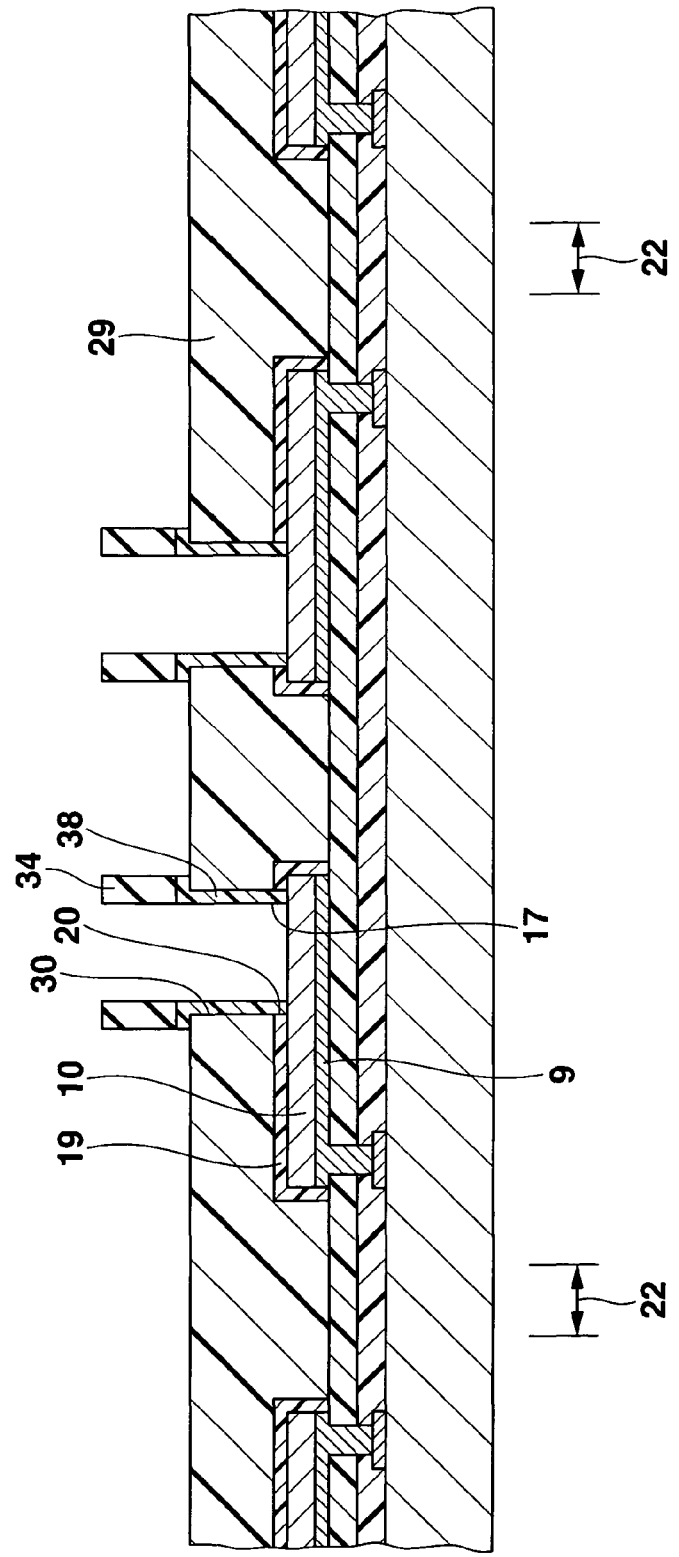
FIG. 31 is a sectional view in a step following FIG. 30.

Next, the third inorganic insulating film 38 is subjected to dry etching using the positive resist film 34 as a mask so that the third inorganic insulating film 38 only remains under the positive resist film 34, as shown in FIG. 31. That is, the third inorganic insulating film 38 is formed on the inner wall surfaces of the openings 20 of the second inorganic insulating film 19, on the inner wall surfaces of openings 30 of the overcoat film and on the upper surface of the overcoat film 29 around the openings 30. In this state, the connection pad portions of the wiring lines 8 are exposed via openings 17 formed in the third inorganic insulating film 38. Then, the resist film 34 is released.

Here, the dry etching in this case should preferably be the high-density plasma dry etching which permits a longer mean free path of a gas converted into plasma, in order to minimize the etching of the third inorganic insulating film 38 formed particularly on the inner wall surfaces of the openings 20, 12 of the second inorganic insulating film 19 and the overcoat film 29.

For example, a helicon wave (whistler wave) etching device can generate high-density plasma under a high vacuum, and is preferable. In this case, if $CF_4$ is used as a process gas to which $OH_2$ is added at 5 to 10% of the total, etching efficiency can be increased. Moreover, an inductively coupled plasma etching device capable of generating high-density plasma may be used.

Figure 32:
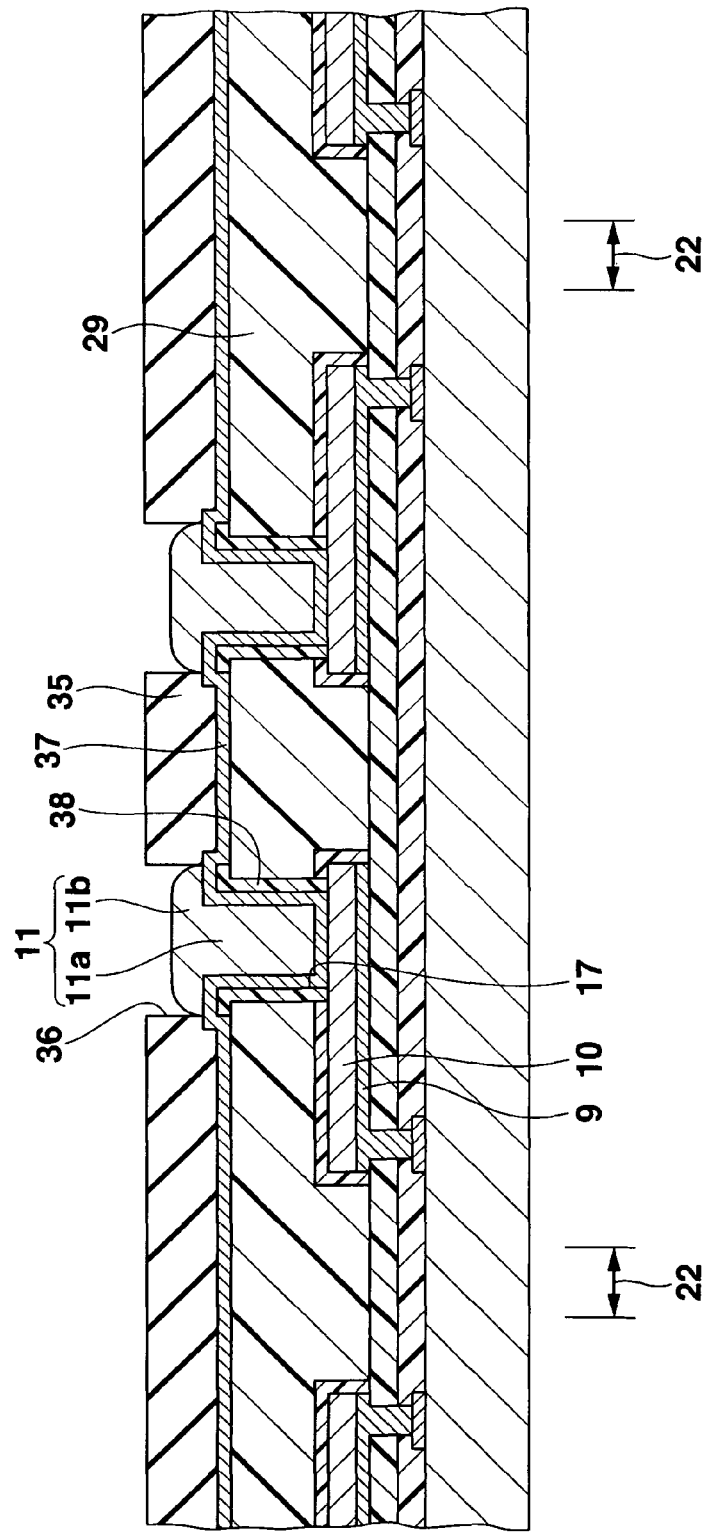
FIG. 32 is a sectional view in a step following FIG. 31.

Next, as shown in FIG. 32, a foundation metal layer 37 is formed by, for example, sputtering of copper on the upper surfaces of the connection pad portions of the wiring lines 8 exposed via the openings 17 of the third inorganic insulating film 38, on the third inorganic insulating film 38 and the entire upper surface of the overcoat film 29. Then, a plating resist film 35 is patterned/formed on the upper surface of the foundation metal layer 37. In this case, an opening 36 slightly greater than the opening 17 of the third inorganic insulating film 38 is formed in a part of the plating resist film 35 corresponding to a region where an upper columnar electrode portion 11b of a columnar electrode 11 is formed.

Next, electrolytic plating with copper is carried out using the foundation metal layer 37 as a plating current path in order to form a lower columnar electrode portion 11a in the foundation metal layer 37 of the opening 17 of the third inorganic insulating film 38 and then form the upper columnar electrode portion 11b on the lower columnar electrode portion 11a in the opening 36 of the plating resist film 35 and on the upper surface of the foundation metal layer 37.

In this case as well, as the opening 36 of the plating resist film 35 is slightly greater than the opening 17 of the third inorganic insulating film 38, plating is isotropically deposited in the opening 36 of the plating resist film 35. Therefore, the upper columnar electrode portion 11b formed in the opening 36 of the plating resist film 35 has a bulging shape. Thus, the columnar electrode 11 composed of the lower columnar electrode portions 11a and the upper columnar electrode portion 11b is formed.

Figure 33:
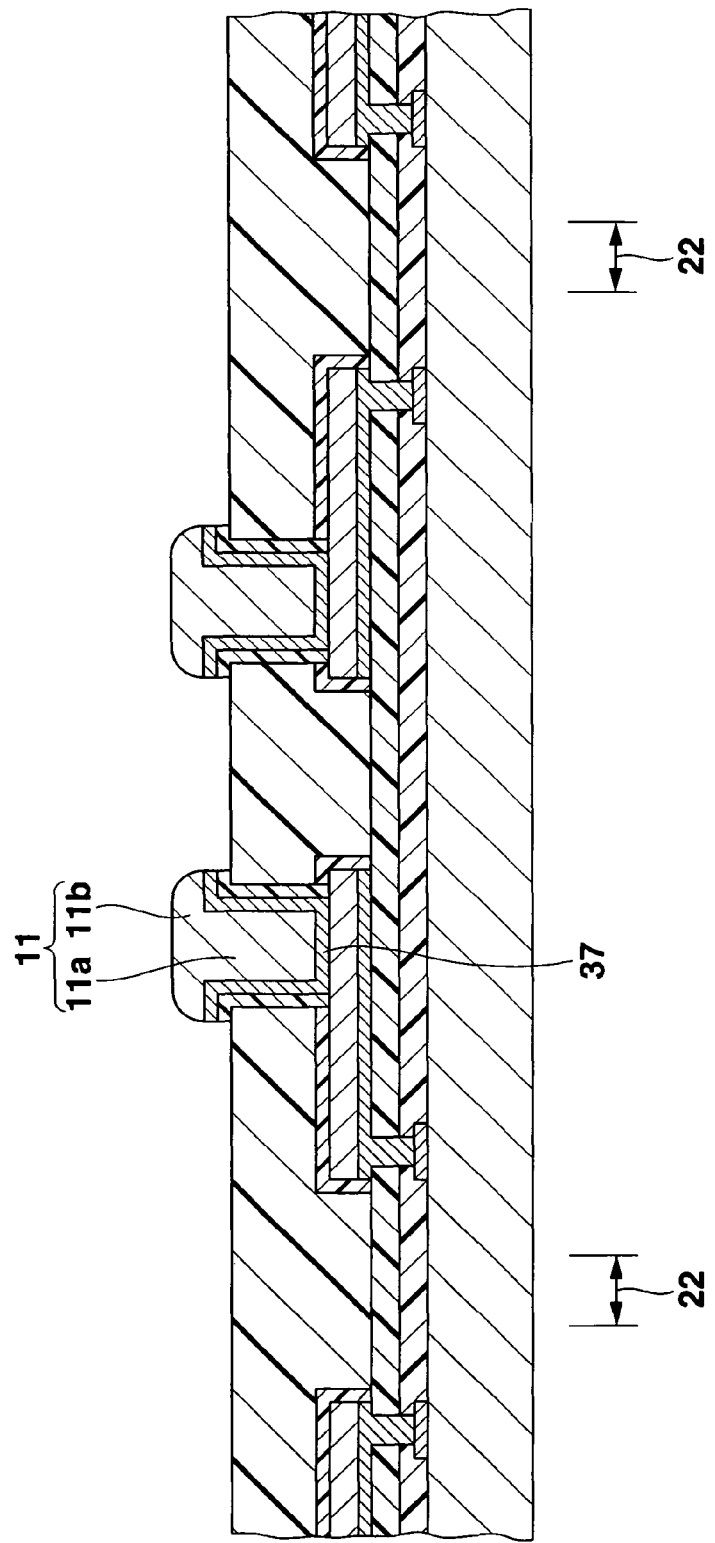
FIG. 33 is a sectional view in a step following FIG. 32.

Next, the plating resist film 35 is released, and then the foundation metal layer 37 in regions which are not under the columnar electrodes 11 are etched and removed using the columnar electrodes 11 as masks, whereby the foundation metal layer 37 remains under the columnar electrodes 11 alone, as shown in FIG. 33. Subsequently, as in the manufacturing method in the third embodiment described above, a plurality of semiconductor devices shown in FIG. 26 are obtained by a flux application step, a solder ball forming step and a dicing step.

In the semiconductor device in the fourth embodiment thus obtained, the surfaces of the wiring lines 8 except for the connection pad portions are covered with the second inorganic insulating film 19 made of an inorganic material containing silicon oxide or silicon nitride as the main component, and the outer peripheral surface of the lower columnar electrode portion 11a of the columnar electrode 11 is covered with the third inorganic insulating film 38 made of an inorganic material containing silicon oxide or silicon nitride as the main component. Thus, it is possible to hold down the generation of electromigration between the wiring lines 8, between the columnar electrodes 11 and between the wiring line 8 and the columnar electrode 11.

Fifth Embodiment

Figure 34:
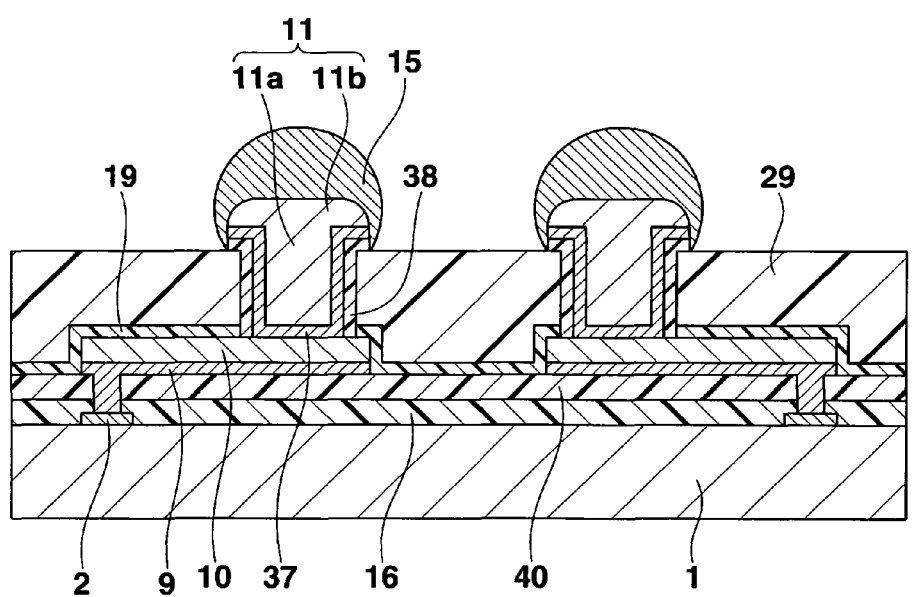
FIG. 34 is a sectional view of a semiconductor device as a fifth embodiment of this invention.

FIG. 34 is a sectional view of a semiconductor device as a fifth embodiment of this invention. This semiconductor device is different from the semiconductor device shown in FIG. 26 in that a second inorganic insulating film 19 having openings 20 is provided not only on wiring lines 8 but also on the entire upper surface of an organic protective film 40. In one example of a method of manufacturing this semiconductor device, a step shown in FIG. 30 may be carried out after a step shown in FIG. 21, which is not described in detail.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a plurality of wiring lines which are provided on one side of the semiconductor substrate and which have connection pad portions;
   a plurality of columnar electrodes respectively provided on the connection pad portions of the wiring lines, each of the columnar electrodes including an outer peripheral surface and a top surface;
   an electromigration prevention film including a first portion provided on surfaces of the wiring lines and second portions provided around the outer peripheral surfaces of the columnar electrodes, wherein the electromigration prevention film includes one of a polyimide resin and a PBO resin; and
   a sealing film provided around the second portions of the electromigration prevention film, wherein the sealing film includes fillers;
   wherein an upper surface of each of the second portions of the electromigration prevention film extends to an outer surface of the sealing film.

2. The semiconductor device according to claim 1, wherein the wiring lines include a metal including copper, and the columnar electrodes include copper.

3. The semiconductor device according to claim 1, wherein the fillers include silica.

4. The semiconductor device according to claim 1, wherein the sealing film includes an epoxy resin, and the fillers include silica.

5. A semiconductor device comprising:
   a semiconductor substrate;
   a plurality of wiring lines which are provided on one side of the semiconductor substrate and which have connection pad portions;
   a plurality of columnar electrodes respectively provided on the connection pad portions of the wiring lines, each of the columnar electrodes including an outer peripheral surface and a top surface;
   an electromigration prevention film provided on the surfaces of the wiring lines and having cylindrical projecting portions covering the outer peripheral surfaces of the columnar electrodes, wherein the electromigration prevention film includes one of a polyimide resin and a PBO resin; and
   a sealing film provided around outer peripheral surfaces of the cylindrical projecting portions, wherein the sealing film includes fillers, wherein an upper surface of each of the cylindrical projecting portions of the electromigration prevention film extends to an outer surface of the sealing film.

6. The semiconductor device according to claim 5, wherein the fillers include silica.

7. The semiconductor device according to claim 5, wherein the sealing film includes epoxy resin, and the fillers include silica.

* * * * *